US009187318B2

(12) United States Patent
Duan et al.

(10) Patent No.: US 9,187,318 B2
(45) Date of Patent: Nov. 17, 2015

(54) LASER MICRO/NANO PROCESSING SYSTEM AND METHOD

(75) Inventors: Xuanming Duan, Beijing (CN); Shu Chen, Beijing (CN); Hongzhong Cao, Beijing (CN); Xianzi Dong, Beijing (CN); Zhensheng Zhao, Beijing (CN)

(73) Assignee: Technical Institute of Physics and Chemistry of the Chinese Academy of Sciences, Beijing (CN)

( * ) Notice: Subject to any disclaimer, the term of this patent is extended or adjusted under 35 U.S.C. 154(b) by 23 days.

(21) Appl. No.: 13/824,634

(22) PCT Filed: Sep. 15, 2011

(86) PCT No.: PCT/CN2011/001567
§ 371 (c)(1),
(2), (4) Date: Mar. 18, 2013

(87) PCT Pub. No.: WO2012/037780
PCT Pub. Date: Mar. 29, 2012

(65) Prior Publication Data
US 2013/0183833 A1      Jul. 18, 2013

(30) Foreign Application Priority Data

Sep. 21, 2010   (CN) .......................... 2010 1 0290490
Jul. 4, 2011    (CN) .......................... 2011 1 0185710
Jul. 28, 2011   (CN) .......................... 2011 1 0214482

(51) Int. Cl.
*H01L 21/00*      (2006.01)
*B81C 1/00*       (2006.01)
(Continued)

(52) U.S. Cl.
CPC ......... *B81C 1/00428* (2013.01); *B23K 26/0613* (2013.01); *B23K 26/0635* (2013.01);
(Continued)

(58) Field of Classification Search
CPC .................... H01L 21/0217; H01L 21/02098; H01L 21/02675
USPC ....... 438/463, 487, 535, 778, 940, FOR. 418, 438/FOR. 419, 795
See application file for complete search history.

(56) References Cited

U.S. PATENT DOCUMENTS 6,507,003 B2 * 1/2003 Amako et al. ........... 219/121.76
6,809,291 B1   10/2004 Neil et al.
(Continued)

FOREIGN PATENT DOCUMENTS

CN       1862354      11/2006
CN       1981291       6/2007
CN     101458451       6/2009

OTHER PUBLICATIONS

International Search Report of PCT/CN2011/001567 dated Dec. 22, 2011.

*Primary Examiner* — Brook Kebede
(74) *Attorney, Agent, or Firm* — Rankin, Hill & Clark LLP

(57) ABSTRACT

A laser micro/nano processing system (100, 200, 300, 400) comprises: a laser light source used to provide a first laser beam having a first wavelength and a second laser beam having a second wavelength different from the first wavelength, with the pulse width of the first laser beam being in the range from a nanosecond to a femtosecond; an optical focusing assembly used to focus the first laser beam and the second laser beam to the same focal point; and a micro mobile platform (21) controlled by a computer. Also disclosed are a method for micro/nano-processing photosensitive materials with a laser and a method for fabricating a device with a micro/nano structure using laser two-photon direct writing technology. In the system and methods, spatial and temporal overlapping of two laser beams is utilized, so as to obtain a micro/nano structure with a processing resolution higher than that of a single laser beam, using an average power lower than that of a single laser beam.

12 Claims, 13 Drawing Sheets

(51) Int. Cl.
  *B23K 26/06* (2014.01)
  *B23K 26/067* (2006.01)
  *B23K 26/08* (2014.01)
  *H01L 21/02* (2006.01)
  *G03F 7/20* (2006.01)

(52) U.S. Cl.
  CPC ......... *B23K26/0639* (2013.01); *B23K 26/0676* (2013.01); *B23K 26/083* (2013.01); *G03F 7/2053* (2013.01); *G03F 7/70375* (2013.01); *H01L 21/02107* (2013.01)

(56) References Cited

U.S. PATENT DOCUMENTS

2006/0158708 A1* 7/2006 Hocheng et al. .............. 359/196
2010/0097680 A1* 4/2010 Naftali et al. ............... 359/205.1

* cited by examiner

LASER MICRO/NANO PROCESSING SYSTEM AND METHOD

FIELD OF THE INVENTION

The present invention relates to laser micro/nano processing, and more particularly to a laser micro/nano processing system and processing method, which precisely controls the processing resolution and accuracy.

BACKGROUND OF THE INVENTION

In the past 50 years, lithography has been dominated the micro/nano processing technology. Since the conventional single-photon lithography is achieved on basis of its planar nature, the processing resolution is restricted by the optical diffraction limit. In order to achieve a higher resolution, the lithography uses the wavelength of the laser output from the light source from infrared laser to DUV KrF laser (248 nm) and ArF laser (193 nm), with processing method from the traditional laser lithography, to X-ray lithography, electron-beam lithography, ion-beam lithography, nanopattern transfer, and so on. These technologies may prepare two-dimensional or quasi-three-dimensional structures by plane method, probe method or modeling method. In order to obtain a higher accuracy and finer feature size, the costs for manufacturing and maintaining the apparatus are very high. Meanwhile it is difficult for the conventional technologies to obtain a micro/nano device with complicated structures. Therefore, there is a need for a flexible, efficient, and low cost method for fabricating a micro/nano device with high resolution and high accuracy.

Direct femtosecond laser writing is a new super-fine processing technology developed in these years. Femtosecond laser lithography confines the area of the reaction between the laser and the substance to a small scope near the focal point by the non-linear optical effect and two-photon absorption effect, and thus may achieve the three-dimensional fabrication with the resolution exceeding the diffraction limit and obtain the micro/nano device with the nano-scaled feature size. Femtosecond laser lithography has the beneficial effects of high accuracy, truly three-dimension and low cost. In 2011, Professor Satoshi Kawata et al. achieved a processing resolution of 120 nm with the negative photoresist SCR500 on the glass substrate by pulsed femtosecond laser at wavelength $\lambda$ of 780 nm, and prepared a three-dimensional nano-bull structure, see Satoshi Kawata et al., "Finer features for functional microdevices", Nature 2001, 412 (6848), 697-698. In 2008, Xian-Zi Dong et al. at Technical Institute of Physics and Chemistry, CAS, achieved a resolution of 50 nm on the glass substrate with the negative photoresist SCR500 using a pulsed femtosecond laser at wavelength of 780 nm by controlling the parameter of the laser, see Xian-Zi Dong et al., "Improving spatial resolution and reducing aspect ratio in multiphoton polymerization nanofabrication", Appl. Phys. Lett., 2008, 92: 091113. In addition, in 2007, Dengfeng Tan et al. at Beijing University achieved a suspended polymer nanolines with line width of 15 nm between the pre-formed cuboids by polymerization shrinkage effect, see Dengfeng Tan et al. "Reduction in feature size of two-photon polymerization using SCR500", Appl. Phys. Lett., 2007, 90: 071106. For the positive photoresist, in 2005, B. N. Chichkov, et al. achieved a processing resolution of 140 nm by using a diluted photoresist (g-line 51813, Shipley Company LLC), and prepared a three-dimensional hollow wood-pile structure, see Claude Phipps, "Laser ablation and its applications", Springer. 2007, 141-142.

Some scientists proposed to use two laser beams to further improve the resolution, one for inducing the photopolymerization reaction and another for confining the reaction with the material only at the center of the focal point of the excitation laser for initiating, which significantly breaks through the diffraction limit. Timothy F. Scott et al. achieved to confine the reaction area to a very small area of the focal point of the exciting light and obtained a processing resolution smaller than the diffraction limit by using one laser beam from all-solid-state laser at a wavelength of 473 nm to excite the free radical to induce photopolymerization, and using another laser beam from Ar ion laser at a wavelength of 365 nm to dissipate the free radicals around the focal point of the excitation laser, see Timothy F. Scott et al. Science, 2009, 324 (5929), 913. Linjie Li et al. achieved a longitudinal resolution of 40 nm by using near infrared laser at a wavelength of 800 nm, pulse width of 200 fs from the femtosecond laser to induce the material polymerization through a two-photon absorption, and using another pulsed laser at the same wavelength, pulse width of 50 ps to depleting the free radicals so as to control the degree and extent of the polymerization near the focal point of the exciting light, see Linjie Li, et al. Science, 2009, 324 (5929), 910. Trisha L. Andrew et al. tried to cover on the photoresist a photochromic film, which passes through a laser at wavelength of 325 nm and absorbs the laser at wavelength of 325 nm at the reaction area under the laser at wavelength of 633 nm from He—Ne laser, and use Lloyd's-mirror interferometer to interfere the two lasers and have alternate bright and dark interfere stripes, such that the laser at wavelength of 325 nm passed through the photochromic film in extremely small area reacts with the photoresist to achieve a lateral processing resolution of 36 nm, see Trisha L. Andrew et al., Science, 2009, 324 (5929), 917. However, the above mentioned methods are only be applicable to the materials that can be excited by laser and their excited state may be depleted, and are not applicable to other materials.

Furthermore, some scientists started to use femtosecond laser to induce the multiphoton reduction of metal ions to achieve micro/nano structures. In 2000, Pu-Wei Wu et al., focused the femtosecond laser into the metal ion doped transparent silica gel to reduce the metal ion to metal atom by charge transfer procedure from the excited state of silica gel having absorbed multiphotons to the noble metal ion, and thus prepared a three-dimensional micron helix, see Pu-Wei Wu et al., Two-Photon photographic production of three-dimensional metallic structures within a dielectric matrix, Advanced Materials, 2000, 12 (19): 1438-1441. In 2006, Takuo Tanaka et al. at RIKEN, Japan, prepared a tilt column and a bowl by directly reducing the silver ion in the $AgNO_3$ aqueous solution with femtosecond laser and obtained a silver line of 400 nm with the resistivity as 3.3 times as the resistivity of the bulk silver, see Takuo Tanaka et al., Two-photo-induced reduction of metal ions for fabricating three-dimensional electrically conductive metallic microstructure, Applied Physics Letters, 2006, 88: 081107. In 2008, Shoji Maruo et al. prepared a silver line in the polymer by reducing the silver ion in polyvinylpyrrolidone with the femtosecond laser. By adjusting the concentration of the silver ion in the polymer, the resistivity of the silver line can be lowered down to as about 2 times as that of the bulk silver, see Shoji Maruo et al., Femtosecond laser direct writing of metallic microstructures by photoreduction of silver nitrate in a polymer matrix, Optics Express, 2008, 16(2): 1174-1179. In 2009, Yao-Yu Cao et al. at Technical Institute of Physics and Chemistry, CAS achieved a silver line with the smoother surface topography by adding surfactant NDSS into ammoniacal silver solution and controlling the size of silver nanoparticles during the femtosecond laser reduction, the tomography and resolution of the silver line are significantly improved, see Yao-Yu Cao et al., 3D metallic Nanostructure Fabrication by surfactant-assisted multiphoton-induced reduction, Small, 2009, 5(10): 1144-1148. In 2010, Bin-Bin Xu at Jilin University prepared a silver line by adding Sodium Citrate into ammoniacal silver solution, which achieved a silver line of 125 nm with its resistivity as about 10 times as that of the bulk silver, see Bin-Bin Xu et al., Flexibly metal nanowiring on nonplanar substrates by femtosecond laser induced electroless plating, Small, 2010, 6(16): 1762-1766. However, currently fabrication of the metal micro/nano structure with femtosecond laser may achieve the resolution more than one hundred nanos, it is difficult to achieve a metal structure of nano-scale.

Therefore, there is a need to provide a laser micro/nano processing system and processing method which scans the material to be processed with the laser at wavelength matching the optical absorptive characteristics of the material so as to precisely control the resolution and the accuracy.

Normally, the glass sheet applied with the photoresist is placed on the micromovement stage of the femtosecond laser fabrication apparatus. The incident laser beam passes through the oil immersion objective and irradiates the photoresist from the bottom of the glass so as to achieve a small focal spot and the improved resolution due to the matching refractive indexes of the oil and the glass, and to protect the objective lens from damaging. Therefore, the conventional femtosecond laser technology is limited to process the photosensitive material formed on the glass substrate. Therefore, there is a need to provide a laser two-photon direct-writing technology which may process the photoresist formed on various types of substrates and may be applied in various application fields.

SUMMARY OF THE INVENTION

One object of the present invention is to provide a laser micro/nano fabrication method and fabrication system, by which the fabrication resolution and accuracy can be precisely controlled. According to the invention, by selecting two laser beams to have the wavelengths matching the characteristics of the photosensitive material to be processed and irradiating selected laser beams, the range of the materials applicable to laser micro/nano fabrication may be extended and the accuracy of the laser micro/nano fabrication will be improved.

Another object of the present invention is to provide a laser micro/nano fabrication method and fabrication system, which is low cost, easy to be operated and may achieve structures with high resolution A further object of the present invention is to provide a method for fabricating micro/nano structural device by laser two-photon direct-writing, which is completely compatible with the semiconductor process. By laser two-photon direct writing to expose the photoresist applied on a substrate, the pattern corresponding to the micro/nano structural device is formed in the photoresist, and thus the micro/nano structural device, especially micro/nano structural semiconductor devices with micro/nano-scaled feature size may be achieved.

The method of the invention for fabricating micro/nano structural device by laser two-photon direct-writing may have the beneficial effects of truly three-dimension, super-resolution and high accuracy, and low cost.

When superposing two laser beams of different wavelengths and focusing the superimposed laser beams to the same focal point, the light intensity distribution of the laser beam at the focal point is determined by a product of intensity distribution functions at the focal point of the two laser beams. By comparing the Full Width at Half Maximum (FWHM) of intensity distribution function characterizing the laser spot diameter, it can be seen that the FWHM of the product of the intensity distribution functions of the superimposed laser beams is less than the FWHM of the square of the intensity of a single laser beam. Thus, by superposing two laser beams of different wavelengths and applying the superposed laser beams to the photosensitive material having a two-photon absorption effect, the resolution thus obtained is higher than that obtained by applying a single laser beam to the same photosensitive material. The followings will discuss in detail the intensity distribution function at the focal point of the superposed laser beams of different wavelengths, and the relationship between the intensity distribution function and the processing resolution.

According to Debye's method, see J. Stamners, Waves in Focal Regions, Adam Hilger, Bristol, 1986, for a light at wavelength $\lambda$, in polarization direction $\phi$, focused by a objective with aperture angle $\alpha$, the intensity distribution function is:

$$I(u, v, \varphi) = |E|^2 \quad \text{(eq. 1)}$$
$$= |I_a|^2 + |I_c|^2 + 4|I_b|^2 cos^2\phi + 2\text{Re}\{I_a I_c^*\}\cos 2\phi$$

where, $$I_a = I_a(u, v) \quad \text{(eq. 1-1)}$$
$$= \int_0^\alpha cos^{1/2} \theta \sin\theta (1 + \cos\theta) J_0\left(\frac{v\sin\theta}{\sin\alpha}\right) \times$$
$$\exp(iu\cos\theta/\sin^2\alpha)d\theta$$

$$I_b = I_b(u, v) \quad \text{(eq. 1-2)}$$
$$= \int_0^\alpha cos^{1/2} \theta \sin^2\theta J_1\left(\frac{v\sin\theta}{\sin\alpha}\right) \times \exp(iu\cos\theta/\sin^2\alpha)d\theta$$

$$I_c = I_c(u, v) \quad \text{(eq. 1-3)}$$
$$= \int_0^\alpha cos^{1/2} \theta \sin\theta (1 - \cos\theta) J_2\left(\frac{v\sin\theta}{\sin\alpha}\right) \times$$
$$\exp(iu\cos\theta/\sin^2\alpha)d\theta$$

in which, $\mu$ and $v$ are optical coordinates, $u=znk \sin^2\alpha$, $v=rnk \sin\alpha$; $r=\sqrt{x^2+y^2}$, $k=2\pi/\lambda$, $$\sin\alpha = \frac{NA}{n},$$

NA is numerical aperture of the objective; n is refractive index of the material to be processed; $J_0, J_1, J_2$, each of which are the Bessel functions of the first kind, $\phi=0$ or $\pi/2$ indicates that the polarization direction of the laser is x or y.

As can be seen from the above, the intensity distribution function depends on the wavelength $\lambda$ and polarization direction of the laser beam. In case that the two laser beams at different wavelengths are focused by the same objective to the same focal point, the intensity distribution of the superposed beams at the focal point is calculated by calculating the respective intensity distribution functions $l_1$ and $l_2$ for the two beams and then calculating the product to obtain the intensity distribution at the focal point of the superposed laser beams.

As an example, a first laser at $\lambda_1=800$ nm and a second laser at $\lambda_2=500$ nm, traveling in z direction, are focused on the material with refractive index n=1.515 through a objective with NA=1.45, the product of the intensity distribution functions $l_1$ and $l_2$ at the focal point and in the direction traversing to the laser traveling direction, is calculated, the result of which is show in FIG. 1.

In FIG. 1, $l_1$ and $l_2$ represent the intensity of the laser at 800 nm and the intensity of the laser at 500 nm, respectively, Ix and Iy indicate that the lasers are linearly polarized in x direction and in y direction, respectively. It can be seen from the FWHM of the product of the intensity distribution functions at the focal point of the superposed laser beams is less than the FWHM of the square of the intensity distribution function at the focal point of the single laser beam at 800 nm, while the FWHM is affected by the polarization direction also.

As another example, a first laser at $\lambda_1=800$ nm and a second laser at $\lambda_2=400$ nm, traveling in z direction, are focused on the material with refractive index n=1.515 through a objective lens with NA=1.45, the product of the intensity distribution functions $l_1$ and $l_2$ at the focal point and in the direction traversing to the laser traveling direction, is calculated, the result of which is show in FIG. 2.

In FIG. 2, $l_1$ and $l_2$ represent the intensity of the laser at 800 nm and the intensity of the laser at 400 nm, respectively, Ix and Iy indicate that the lasers are linearly polarized in x direction and in y direction, respectively. It can be seen from the FWHM of the product of the intensity distribution functions at the focal point of the superposed laser beams is less than the FWHM of the square of the intensity distribution function at the focal point of the single laser beam at 800 nm, while the FWHM is affected by the polarization direction also.

It may be known from equation 1 and the calculation results show in FIGS. 1 and 2, when two lasers at the different wavelengths are focused to a same focal point, the diameter of the beam spot formed at the focal point is less than that of the beam spot formed at the focal point formed by the single laser beam. In other words, when two laser beams at different wavelengths are superposed to scan the photosensitive material having two-photon absorption effect, the reaction of the superposed laser beam with the photosensitive material do not take place in all areas they pass through, but only in the area where the power of the superposed laser beam is above the threshold inducing the photosensitive material to occur the two-photon absorption and initiates a photochemical reaction. The term of two-photon absorption in the context of the application means a multi-photon absorption that the substance may absorb two, more than two, or even tens of photons at the same time, including but not limited to the two-photon absorption where the substance absorb two photons. By adjusting the powers of the two laser beams respectively, the area of the reaction of the superposed beam with the photosensitive material may be confined to the focal spot of the superposed beams, and the thus resultant resolution is higher than the resolution achieved by the two-photon effect with the single laser beam. Furthermore, by adjusting the polarization directions of the two laser beams, the resolution may be further improved.

Furthermore, when scanning a solution containing the metal ions to be processed by the superposed beams formed from two laser beams at different wavelengths, the metal ions to be processed in the solution may occur a multi-photon absorption effect to the lasers and further induce a photochemical reduction to reduce the metal ions to metal nanoparticles. The location of the just formed metal nanoparticles may be changed by the laser optical tweezers. By adjusting the wavelength of one of the two laser beams to the wavelength at which the metal ions may absorb multiple photons to induce multi-photon absorption effect and to initiate photochemical reaction such that the metal ions may be reduced to metal nanoparticles. By adjusting the wavelength of another laser beam to the wavelength at which the just formed metal nanoparticles may occur optical tweezers such that the just formed metal nanoparticles may be aggregated towards the centre of the focal point of the laser to form a micro/nano structure. Preferably, by adjusting the wavelength of another laser beam to the wavelength at which the just formed metal nanoparticles may occur optical tweezers together with heating effect of surface plasmons, such that the just formed metal nanoparticles may aggregate towards the centre of the focal point of the laser and melt to form a micro/nano structure. To compare that the processing resolution of the metal nanoparticles achieved by reducing the metal ions with a single laser beam depends on the square of the intensity distribution function at the focal point of the laser beams, a metal micro/nano structure with higher processing resolution and more complexity may be obtained by combining the laser multiphoton reduction, optical tweezers, and heating effect of surface plasmon.

According to one aspect of the present invention, there provides a laser micro/nano fabrication system, the system comprises:
  a laser light source for providing a first laser beam having a first wavelength and a second laser beam having a second wavelength being different from the first wavelength, the first laser beam having a pulse width in range of nanosecond to femtosecond;
  an optical focusing assembly for focusing the first laser beam and the second laser beam to a same focal point; and
  a computer controlled micromovement stage.

The above-mentioned optical focusing assembly may include beam expanders for expanding the first laser beam and the second laser beam respectively, a dichroic mirror and a reflecting mirror for superposing the first laser beam and the second laser beam to superposed laser beams traveling along the same light path, and an objective for focusing the superposed laser beam. The objective may be a non-immersion objective, water immersion objective, or oil immersion objective. According to a preferred embodiment of the invention, the laser micro/nano fabrication system may further include a first wave plate for changing the polarization state of the first laser beam and a second wave plate for changing the polarization state of the second laser beam. The computer controlled micromovement stage is a three-dimensional micromovement stage, which is movable in x, y and z-directions in range of 1 nm-300 mm.

The laser micro/nano fabrication system of the invention may further include a first optical shutter for adjusting the exposure time of the first laser beam and a second optical shutter for adjusting the exposure time of the second laser beam, for example, to 1 ms-10 min, respectively, and also include optical attenuators for adjusting the average power of the first laser beam and the second laser beam to for example 0.1 µW-1 W, respectively.

Preferably, the first laser beam has a repetition frequency in range of 1 Hz-200 MHz, a wavelength in range of 157 nm-1064 nm.

Preferably, the laser light source in the laser micro/nano fabrication system may include a first pulsed laser for providing the first laser beam and a second pulsed laser for providing the second laser beam having a pulse width in range of nanosecond to femtosecond, the repetition frequency in range of 1 Hz-200 MHz, and the wavelength being adjustable in range of 157 nm-1064 nm. Preferably, the polarization states of the first laser beam and the second laser beam may be natural, linear polarization, circular polarization or elliptical polarization. As an alternative, the laser light source of the laser micro/nano fabrication system may include a pulsed laser for generating a first laser beam at a first wavelength, a half reflecting and half transmitting mirror for splitting the first laser beam into the first laser beam traveling along a first light path and a second laser beam traveling along a second light path, as well as a frequency multiplier for multiplying the frequency of the first laser beam or the frequency of the second laser beam. The laser micro/nano fabrication system further includes an optical delay assembly for adjusting the optical path of the first laser beam or of the second laser beam such that the lag between the times when the first laser beam and the second laser beam arrive at the focal point is not more than the lifetime of the excited state of the photosensitive material to be processed. The optical delay assembly may include four reflecting mirrors provided on a one-dimensional micromovement platform. The optical path of the first laser beam or the second laser beam may be changed by adjusting the one-dimensional micromovement stage. Alternatively, the optical delay assembly may include two right-angle prisms provided on the one dimensional micromovement platform. The optical path of said first laser beam or the second laser beam may be changed by adjusting the stage. The movement of the stage may be in range of, for example, 0.1 μm-1 m.

Furthermore, in the laser micro/nano fabrication system of the invention, the second laser beam may be a continuous wave laser beam having a wavelength in the range of 300 nm-1064 nm.

As another aspect of the present invention, there provides a laser micro/nano fabrication method, the method comprises:

adjusting a laser light source to output a first laser beam having a first wavelength and a second laser beam having a second wavelength being different from the first wavelength, the first wavelength of the first laser beam is capable of inducing a photosensitive material to be processed to occur two-photon effects, the first laser beam having a pulse width in range of nanosecond to femtosecond;

adjusting an optical focusing assembly to focus the first laser beam and the second laser beam to a same focal point; and adjusting a computer controlled micromovement stage such that the photosensitive material to be processed on the stage is exposed at the focal point.

Preferably, the photosensitive material to be processed is selected from organic photosensitive materials, inorganic photosensitive materials and photosensitive materials containing metal ions.

Preferably, the micro/nano structure obtained by the method is one-dimensional structure, two-dimensional structure or three-dimensional structure.

Preferably, in the method, the second laser beam is a pulsed laser having a pulse width in range of nanosecond to femtosecond. The method further comprises steps of adjusting the wavelength of the second laser beam output from the laser light source to a second wavelength being capable of inducing the photosensitive material to be processed occur two-photon effect; and adjusting the optical path of the first laser beam or the optical path of the second laser beam such that the lag between the times when the first laser beam and the second laser beam arrive at the focal point is not more than the lifetime of the excited state of the photosensitive material to be processed.

Preferably, the step of focusing the first laser beam and the second laser beam to the same focal spot further comprises the steps of expanding the first laser beam and the second laser beam, superposing the expanded first laser beam and the expanded second laser beam to obtain the superposed laser beams traveling along the same light path; and focusing the superposed laser beam to the same focal spot to expose the photosensitive material to be processed.

Furthermore, the laser micro/nano fabrication method according to the invention further includes, changing the exposure times of the first laser beam and second laser beam to 1 ms-10 min by adjusting the optical shutters in the first light path and in the second light path, respectively, and changing the average exposure powers of the first laser beam and the second laser beam to 0.1 μW-1 W, by adjusting the optical attenuators in the first light path and in the second light path, respectively.

Preferably, the above-mentioned organic photosensitive material is selected from the group consisting of the organic materials that may occur photopolymerization reaction, the organic materials that may occur photodecomposition reaction, the organic materials containing molecules that may occur photocrosslinking reaction, and the organic materials containing molecules that may occur photoisomerization reaction.

Preferably, the above-mentioned inorganic photosensitive material is selected from the group consisting of the inorganic materials that may occur photopolymerization reaction, the inorganic materials that may occur photodecomposition reaction, the inorganic materials containing molecules that may occur photocrosslinking reaction, the inorganic materials containing molecules that may occur photoreduction reaction, and the inorganic materials containing molecules that may occur photooxidation reaction.

Preferably, the above-mentioned photosensitive material containing metal ions is selected from the group consisting of the inorganic materials containing metal ions of the molecules that may occur photoreduction reaction, the organic materials containing metal ions of the molecules that may occur photoreduction reaction, the inorganic materials containing metal ions of the molecules that may occur photooxidation reaction, and the organic materials containing metal ions of the molecules that may occur photooxidation reaction.

In addition, in case that the photosensitive material is a metal ion solution, the method further includes steps of adjusting the first laser beam to reduce the metal ions to metal nanoparticles, and adjusting the second wavelength of the second laser beam such that the formed metal nanoparticles occur optical tweezers, the second laser beam is continuous wave laser beam.

Preferably, the step of adjusting the second wavelength of the second laser beam such that the metal nanoparticles occur optical tweezers further comprises adjusting the second wavelength of the second laser beam such that the metal nanoparticles occur surface plasma absorption and optical tweezers.

Preferably, the metal ion solution comprises silver ion solution, gold ion solution, platinum ion solution, copper ion solution, ferric ion solution, nickel ion solution, cobalt ion solution, or palladium ion solution.

Preferably, the metal ion solution further comprises surfactant.

In a preferred embodiment of the invention, the metal ion solution is applied to a substrate and is covered with an auxiliary transparent substrate. The substrate is, for example, glass substrate, quartz substrate, ceramic substrate, or semiconductor substrate. The metal ion solution further comprises a sodium salt of n-decanoylsarcosine sodium, sodium citrate, cetyl trimethylammonium bromide, sodium dodecyl benzene sulfonate, sodium butyrate, sodium valproate, sodium caproate, sodium caprylate, sodium caprate, or a mixture including at least two of them.

Preferably, the scan speed of the laser focus in the metal ion solution is 1 mm/ms-1 nm/ms.

As a further aspect of the invention, there provides a method for fabricating micro/nano structural device by laser two-photon direct writing, comprising:

applying a photoresist onto a substrate to form a photoresist layer;

adjusting a laser light source to output a first laser beam having a first wavelength and a second laser beam having a second wavelength being different from the first wavelength, both of the first and the second wavelengths being capable of inducing the photoresist to occur two-photon absorption effect, both of the first laser beam and the second laser beam having pulse widths in range of nanosecond to femtosecond;

superposing the first laser beam and the second laser beam to superposed laser beams traveling along the same path;

focusing the superposed laser beams to the same focal point;

scanning the laser focus to expose the photoresist at the designated positions;

developing the photoresist; and transferring the resultant pattern of the photoresist to the substrate.

Preferably, the micro/nano structural device is a semiconductor device.

Preferably, following the step of applying the photoresist to the substrate to form the photoresist layer, the method further includes, placing a auxiliary transparent substrate on the photoresist layer to obtain a sandwich structure including the substrate, the photoresist layer and the auxiliary transparent substrate, irradiating the photoresist with the laser beam from the auxiliary transparent substrate side of the sandwich structure to expose the photoresist at the designated position.

Preferably, the photoresist is a negative photoresist or a positive photoresist.

Preferably, the positive photoresist is UV positive photoresist or DUV positive photoresist.

Preferably, the thickness of the positive photoresist layer is in range of 10 nm to 100 μm.

Preferably, the substrate is selected from the group consisting of substrate of Group IV material, substrate of Group III-V material, substrate of Group II-VI material, silicon-on-insulator substrate, glass substrate formed with a layer of dielectrics, glass substrate and semiconductor substrate formed with a layer of dielectrics.

Preferably, the pattern on the photoresist layer is transferred to the substrate by wet etching, dry etching, evaporation or sputtering of metal, or depositing a semiconductor layer or an insulating layer.

Preferably, following the step of pattern transferring, the method further comprises step of peeling off the photoresist.

The present invention has following beneficial effects.

By superposing the two laser beams both in spatial and in time, the system and the method of the invention may achieve micro/nano structures with a higher processing resolution than the resolution achieved by the single laser beam, at a average power lower than that for the single laser beam.

The method of the invention may precisely control the processing resolution and accuracy by adjusting the exposure energy and the exposure time of the two laser beams reacting with the photosensitive material.

The method of the invention may process various functional materials by selecting of the wavelength of the laser beam to match the characteristics of the photosensitive material to be processed, which extends the range of the materials to be processed.

The method of the invention may improve the resolution of the resultant structure by adjusting the difference of the optical paths of the first pulsed laser beam and the second pulsed laser beam.

According to the present method, the low-cost metal source, e.g. the metal ion aqueous solution is used to directly generate the metal micro/nano structure, which avoids the complicated and noble metal-cost steps in the conventional metal micro/nano structure fabrication, including steps of forming a pattern, evaporating a large square of the metal layer, removing most part of the metal layer to leave only part of the layer as the metal micro/nano structure. By applying and exposing the metal ion aqueous solution to form the metal structure on the substrate directly, the present method simplifies the steps for forming the metal structure and reduces the usage of the metal.

Compared to the conventional semiconductor fabrication method including steps of forming a photomask and exposing the photoresist through the photomask, the step of laser direct-writing the photoresist in the present method simplifies the conventional complicated steps and saves the cost for the photomask. By inducing a two-photon absorption effect of the photoresist, a pattern with the feature size of about 100 nm may be achieved for the positive photoresist, and a pattern with the feature size of less than about 100 nm may be achieved for the negative pattern. By the pattern transferring, the semiconductor device with micro/nano-scale feature size is obtained. The method of the invention is low cost, high efficient, easy to operate and truly three-dimensional, and may be combined to the conventional semiconductor fabrication methods. The semiconductor device of the invention has a micro/nano scaled feature size, which is far less than the micro-scaled feature size achieved by the conventional method, the invention makes miniaturization and further integration of the semiconductor device become possible.

DETAILED DESCRIPTION

With reference to the attached drawings the present invention is explained in combination with the preferred embodiments. It should be noted that the specific details are provided for complete comprehension to the invention. It should be appreciated that the invention is applicable not only to the one or more specific embodiments, but also to other structural elements, wavelengths and materials. The embodiments in the following description should not be construed as limiting the scope of the invention in any way.

The preferred embodiment of the laser micro/nano fabrication system is described in detail as follows.

Figure 1:
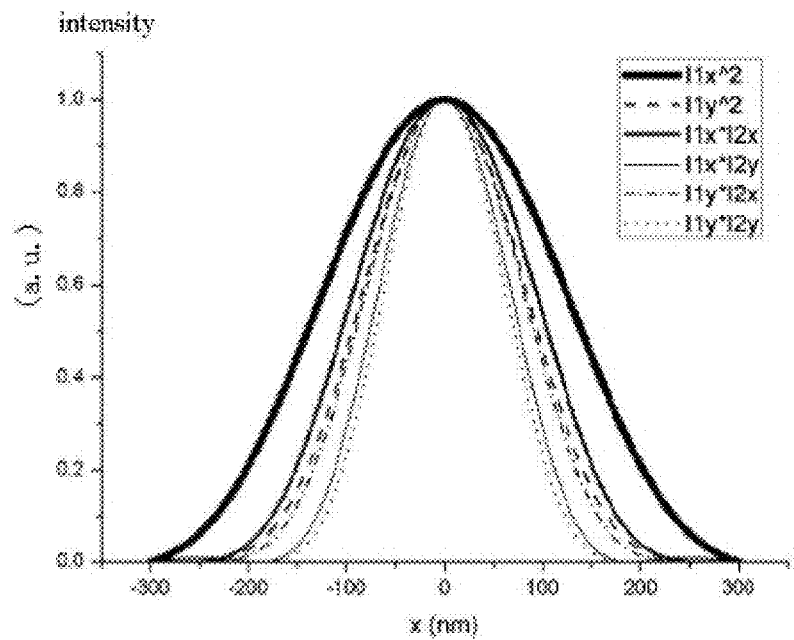
FIG. 1 is a calculated laser intensity distributions at a same focal point of two laser beams at wavelength of 800 nm and 500 nm and at the focal point of the laser beam at wavelength of 800 nm.
Figure 2:
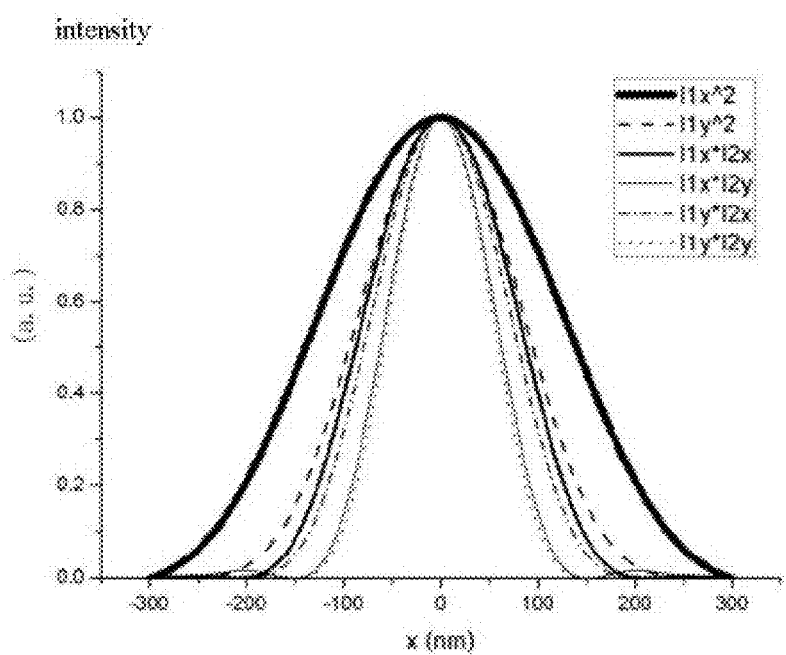
FIG. 2 is a calculated laser intensity distributions at a same focal point of two laser beams at wavelength of 800 nm and 400 nm and at the focal point of the laser beam at wavelength of 800 nm.
Figure 3:
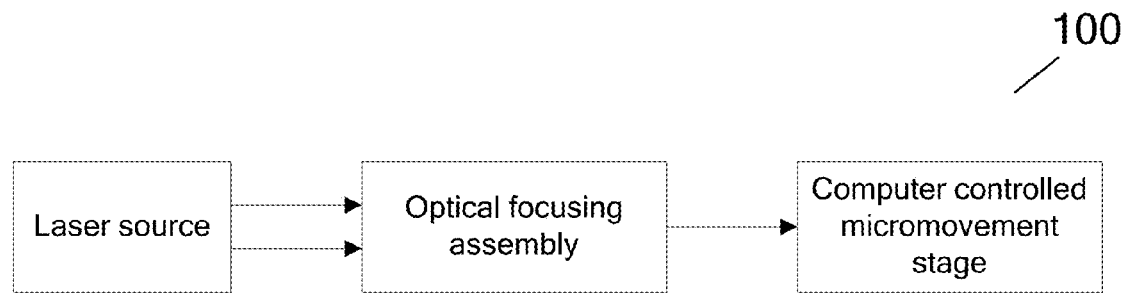
FIG. 3 is a layout of the laser fabrication system of the present invention.

FIG. 3 illustrates a laser micro/nano fabrication system of the present invention. The laser fabrication system 100 includes a laser light source, an optical focusing assembly and a computer controlled micromovement stage. The laser light source is provided for outputting a first laser beam having a first wavelength and a second laser beam having a second wavelength, the second wavelength is different from the first wavelength. The first laser beam has a pulse width in range of nanosecond to femtosecond. The optical focusing assembly is provided for focusing the first laser beam and the second laser beam to a same focal point. The computer controlled micromovement stage is provided for moving the photosensitive material to be processed positioned thereon to the focal point.

The laser light source may include a first pulsed laser for providing the first laser beam and a second laser for providing the second laser beam. The second laser may be a pulsed laser for outputting the laser beam having a pulse width in range of nanosecond to femtosecond, or may be a continuous wave laser for outputting a continuous wave laser beam. Alternatively, the laser light source may include a pulsed laser for outputting the first laser beam having the first wavelength, a half reflecting and half transmitting mirror for splitting the first laser beam into the first laser beam traveling along a first light path and a second laser beam traveling along a second light path, together with a frequency multiplier for multiplying the frequency of the first laser beam or the frequency of the second laser beam, so as to provide the first pulsed laser beam and the second laser beam having different wavelengths.

The optical focusing assembly may include a first beam expander for expanding the first laser beam, a second beam expander for expanding the second laser beam, a dichroic mirror and a reflecting mirror for superposing the first laser beam and the second laser beam into the superposed laser beams traveling along the same light path, and an objective for focusing the superposed laser beam to the same focal point. The objective may be a non-immersion objective, water immersion objective, or oil immersion objective. The system may further include a first wave plate for changing the polarization state of the first laser beam and a second wave plate for changing the polarization state of the second laser beam. The computer controlled micromovement stage is a three-dimensional micromovement stage, which is movable in x, y and z-directions in range of 1 nm-300 mm.

The above-mentioned pulsed laser may output the laser beam having a repetition frequency in range of 1 Hz-200 MHz, a wavelength in range of 157 nm-1064 nm. The above-mentioned continuous wave laser may output the laser beam having a wavelength in the range of 300 nm-1064 nm, with output power in range of 1 mW-10 W.

The laser micro/nano fabrication system in this embodiment may further include a first optical shutter and a second optical shutter for adjusting the exposure time of the first laser beam and the exposure time of the second laser beam to be in range of, for example 1 ms-10 min, respectively, and also include a first optical attenuator and a second attenuator for adjusting the exposure energy of the first laser beam and the exposure energy of the second laser beam to be in range of for example 0.1 µW-1 W, respectively.

By selecting the wavelength of the first laser beam at which the photosensitive material to be processed may be induced a multiphoton effect, such as a two-photon effect, selecting the wavelength of the second laser beam as desired, and superposing and focusing the two laser beams to the designated positions in the photosensitive material to be processed, the material may be processed precisely with micro/nano scaled feature size. By adjusting the average power and exposure time of the laser beams, a higher resolution and improved accuracy may be achieved.

In case that both of the pulse widths of the first and the second laser beams used in the system are in range of nanosecond to femtosecond, the laser fabrication system preferably includes an optical delay assembly for adjusting the optical path of the first laser beam or the optical path of the second laser beam such that the lag between the times when the first laser beam and the second laser beam arrive at the focal point is not more than the lifetime of the excited state of the material to be processed, so as to improve the processing efficiency.

Embodiment 1

Figure 4:
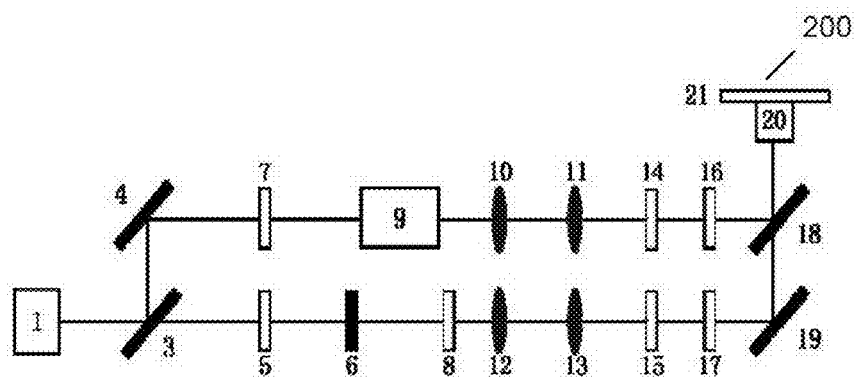
FIG. 4 is a layout of the laser fabrication system according to Embodiment 1 of the invention.

FIG. 4 illustrates a layout of the laser micro/nano fabrication system according to Embodiment 1 of the invention. The laser micro/nano fabrication system 200 includes a laser 1, a half reflecting and half transmitting mirror 3, a frequency multiplier 5, for example a frequency-doubling crystal, an optical delay assembly 9, an optical focusing assembly and a movement stage 21. The laser 1 outputs the pulsed laser beam having a pulse width in range of nanosecond to femtosecond. The half reflecting and half transmitting mirror 3 is placed in the output light path of the laser 1 for forming a transmitting light and a reflecting light. The frequency doubling crystal 5 and a filter 6 are placed in this order along the transmission light path. The filter 6 filters the frequency-doubled laser beam, and in the output of the filter, the ratio of the energy of the frequency-doubled laser beam is not less than 99.5% of the total energy of the laser beam output from the filter. Following the filter, the system 200 further includes lens 12, 13 for expanding the frequency-doubled laser beam in the transmission light path. A reflecting mirror 4 is placed along the main axis in the reflection light path, to keep the light path of the reflective light at fundamental frequency parallel to the light path of the transmission light. Following the reflecting mirror, an optical delay assembly 9 is placed to adjust the optical path such that the lag between the times when the focused laser beams arrive at the focal point is not longer than the lifetime of the excited state of the photosensitive material to be processed. Following that, lens 10 and 11 are placed for expanding the fundamental frequency laser. The system further includes the wave plates 15, 14 placed in the transmission path and the reflection path respectively, for adjusting the polarization state of the lasers in the different paths. Preferably, the wave plate is a full-wave plate, a half-wave plate or a quarter-wave plate of the laser wavelength in the corresponding light path. The optical focusing assembly in the system 200 includes the dichroic mirror 18 and the reflecting mirror 19, for superposing the two laser beams into superposed laser beams, and the objective 20 for focusing the superposed laser beams into the photosensitive material on the computer controlled three-dimensional movement stage 21. Preferably, the objective is a non-immersion objective, water immersion objective, or oil immersion objective, with the numerical aperture of 0.7-1.65, and magnification of 10-100. Three-dimensional micromovement stage is movable in x, y and z-directions preferably in range of 1 nm-200 mm. The system 200 further includes the optical shutters 8, 7 for adjusting the exposure time, and the optical attenuators 17, 16 for adjusting the exposure energies in the transmission path and in the reflection path, respectively. Preferably, the focal length of lens 10, 11, 12 and 13 are each in range of 1 mm-500 mm. In this preferred laser micro/nano fabrication system, the fundamental frequency laser beam and the frequency doubled laser beam are superposed into the superposed laser beams travelling along the same light path, and are focused to the same focal point in the photosensitive material to be processed to expose the material, thus a method for processing the photosensitive material with high resolution and high accuracy is provided.

Figure 5:
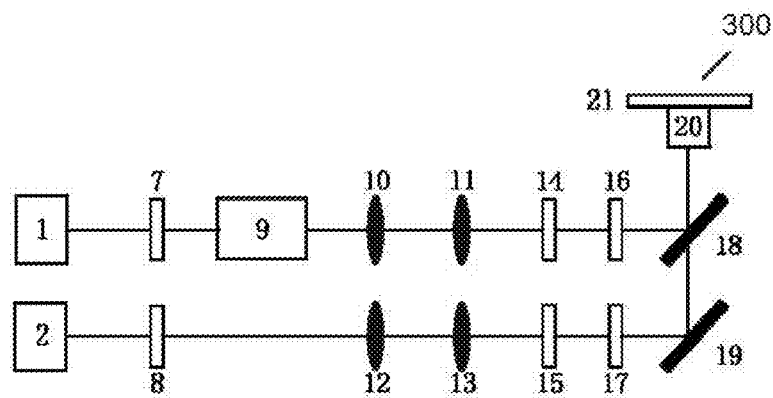
FIG. 5 is a layout of an alternative laser fabrication system according to Embodiment 1 of the present invention.

FIG. 5 illustrates a micro/nano fabrication system as an alternative to embodiment 1. The micro/nano fabrication system 300 includes a laser 1, a laser 2, an optical delay assembly 9, optical focusing assembly and movement stage 21. The laser 1 generates a first pulsed laser having a first wavelength with pulse width in range of nanosecond to femtosecond. The laser 2 generates a second pulsed laser having a second wavelength with pulse width in range of nanosecond to femtosecond, taking the place of the half reflecting and half transmitting mirror 3, the reflecting mirror 4, the frequency doubling crystal 5 and the filter 6 shown in FIG. 4. Except for the laser 2, the other structures in system 300 are the same to the system 200 in FIG. 4.

The micro/nano fabricating method by use of the above-mentioned system includes the following steps:

turning on the laser light source, adjusting the wavelengths of the first laser beam and the second laser beam respectively to the wavelengths being capable of inducing the photosensitive material to be processed occur two-photon effect;

adjusting the optical path of the first laser beam or the optical path of the second laser beam such that the lag between the times when the first laser beam and the second laser beam arrive at the focal point is not more than the lifetime of the excited state of the photosensitive material to be processed adjusting the lenses in the light expanding system in a direction parallel to the main axis and by use of the computer controlled movement stage, the two laser beams are focused through the objective onto the same focal plane; and adjusting the reflecting mirrors, the half reflecting and half transmitting mirror, the right-angle prism, and the dichroic mirror, the two laser beams are focused through the objective onto the same point in the same plane;

placing the sample carrying the photosensitive material onto the sample platform on the three-dimensional micromovement stage, adjusting the polarization states of the laser beams with the wave plates, controlling the exposure time with the optical shutters within 1 ms-10 min; tuning the laser power with e.g., a variable attenuator to control the average laser power focusing on the photosensitive material to be in range of 0.1 μW-1 W;

scanning the focus of the superposed laser beams to the photosensitive material to be processed by the movement of the computer controlled micromovement stage.

In the above method, the photosensitive material may be organic photosensitive material, inorganic photosensitive material, or photosensitive material containing metal ions.

In the above method, the organic photosensitive material is the organic materials that may occur photopolymerization reaction, the organic materials that may occur photodecomposition reaction, the organic materials containing molecules that may occur photo-crosslinking reaction, or the organic materials containing molecules that may occur photoisomerization reaction.

In the above method, the inorganic photosensitive material is the inorganic materials that may occur photopolymerization reaction, the inorganic materials that may occur photodecomposition reaction, the inorganic materials containing molecules that may occur photo-crosslinking reaction, the inorganic materials containing molecules that may occur photoreduction reaction, or the inorganic materials containing molecules that may occur photooxidation reaction.

In the above method, the photosensitive material containing metal ions is the inorganic materials containing the metal ions that may occur photoreduction reaction, the organic materials containing the metal ions that may occur photoreduction reaction, the inorganic materials containing the metal ions that may occur photooxidation reaction, or the organic materials containing the metal ions that may occur photooxidation reaction.

The high resolution achieved by the system and method according to the invention is explained with reference to the preferred example.

Example 1

The following will describe the specific steps by example of preparation of linear array structure in the commercial SCR500 photoresist applied on the glass substrate using the laser micro/nano fabrication system of the invention.

Figure 6:
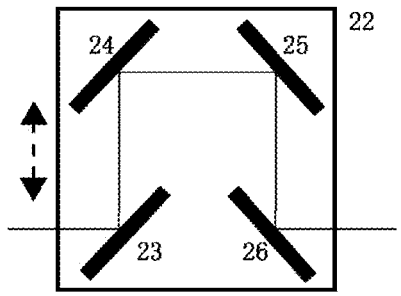
FIG. 6 is a schematic of an optical delay assembly according to one example of the present invention.
Figure 8:
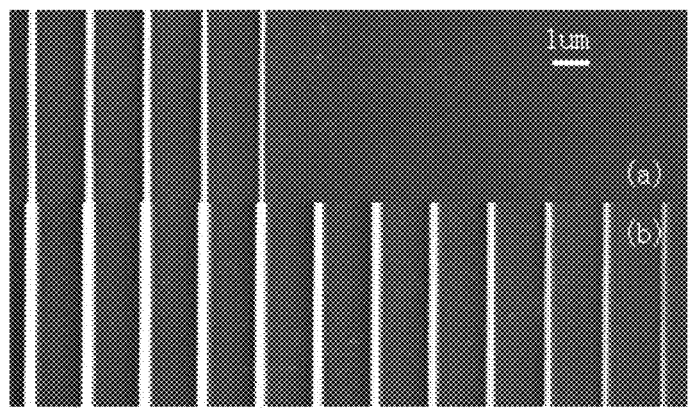
FIG. 8 illustrates SEM photographs of the linear array structures according to example 1 of the present invention and a comparative example 1.

The system used in this example is the laser micro/nano fabrication system 200 shown in FIG. 4. The laser 1 is a femtosecond Ti: sapphire laser, which generates a laser beam having wavelength of 800 nm, pulse width of 100 fs, pulse repetition rate of 82 MHz, diameter of 1.8 mm and being in linear polarization state. In the output light path of the laser 1, there is a half reflecting and half transmitting mirror 3 made of e.g. glass BK7, with the ratio of transmission/reflection of e.g. 7:3, for forming the transmissive light and reflective light. The frequency multiplier 5 on the transmission path includes for example a 1-mm type I BBO frequency-doubling crystal 5 and a interference filter 6 placed in this order along the main axis of the light path for filtering out 800-nm laser. Through the multiplier, a pure frequency-doubled laser beam at wavelength of 400 nm, diameter of 1.2 mm is obtained, where the power of the laser beam at wavelength of 400 nm is not less than 99.5% the total power output from the filter. For example, along the transmission path, the system 200 may further include 60-mm lens 12 and 150-mm lens 13, for example, used as expanding lens for expanding the frequency-doubled laser. In the reflection path of the half transmitting and half reflecting mirror 3, a reflecting mirror 4 made of glass BK7 for example, is placed along the main axis to keep the reflection path to be parallel to the transmission path. Following the mirror 3, the optical delay assembly 9 is provided for adjusting the optical path such that the lag between the times when the two laser beams arrive at the focal point is not longer than the lifetime of the excited state of the photoresist. The optical delay assembly 9 includes a one-dimensional micromovement platform 22 and four reflecting mirrors 23, 24, 25 and 26, made of glass BK7, shown in FIG. 6. Following the optical delay assembly, a 35-mm lens 10 and a 150-mm lens 11, for example, are placed for expanding the fundamental frequency laser. Following that, a 800-nm half-wave plate 14 is provided with its optical axis being consistent with the polarizing direction of the fundamental frequency laser beam. The optical focusing assembly includes a dichroic mirror 18 made of glass BK7 and a reflecting mirror 19 in the light path of the frequency-doubled laser beam for combining the two laser beams into one, together with an oil-immersion objective with the numerical aperture of 1.45, and magnification of 20, for focusing the superposed laser beams into the photosensitive material on the computer controlled three-dimensional micro-movement stage 21. The stage 21 is adjusted such that the focus of the superposed laser beam locates at the interface of the glass substrate and the photosensitive material, and the movement speed of the stage is set to 10 nm/ms. The variable attenuator 17 is adjusted such that the average power of the 400-nm laser is 2.3 μW, the variable attenuator 16 is adjusted such that the average power of the 800-nm laser varies in range of 14.91 mW~11.19 mW. The photosensitive material is thus exposed. The photosensitive material without interacting with the laser beam is removed in the absolute ethyl alcohol solution, and the linear array structure obtained on the surface of the glass substrate is shown in FIG. 8(*b*). The lines in the array structure in FIG. 8(*b*), from left to right, is obtained by the 800-nm laser at corresponding average power of 14.91 mW, 14.50 mW, 14.09 mW, 13.73 mW, 13.36 mW, 13.02 mW, 12.68 mW, 12.36 mW, 12.06 mW, 11.77 mW, 11.48 mW and 11.19 mW. It can be seen, when the processing power of the 400-nm laser beam is kept unchanged, the processing resolution to the photosensitive material may be improved by lowering down the processing power of the 800-nm laser beam. In this example, the average power of the 400-nm laser beam is 2.3 μW, a line structure with feature size less than 100 nm may be achieved when the 800-nm laser at average power of 11.19 mW is used.

Comparative Example 1

The result of the comparative example 1 is obtained by scanning the photosensitive material with only the single 800-nm laser beam, and keeping other conditions of the experiment as the same as that of the example 1. The power of the 400-nm laser beam is adjusted to 0 W with the variable attenuator 17, and the average power of the 800-nm laser beam is varied in range of 14.91 mW~13.36 mW. The photosensitive material is thus exposed. The part of photosensitive material without interacting with the laser is removed in the absolute ethyl alcohol solution, and the linear array structure obtained on the surface of the glass substrate is shown in FIG. 8(*a*). The lines in the array structure in FIG. 8(*a*), from left to right, is obtained by the 800-nm laser at corresponding average power of 14.91 mW, 14.50 mW, 14.09 mW, 13.73 mW, 13.36 mW. The line structure is not observed by further lowering the power down. In this example, a line structure with feature size of about 100 nm may be achieved when the 800-nm laser at average power of 13.36 mW is used.

It can be seen, when the laser micro/nano fabrication system and method of the invention is used, a processing resolution of less than 100 nm may be achieved by adjusting the power of the 800-nm laser and keeping the 400-nm laser constant, which is better than the resolution of 120 nm by use of the single 800-nm laser. Furthermore, by using two laser beams with average power lower than the power of the single laser beam, a micro/nano structure with higher accuracy may be achieved.

Example 2

The specific steps will be described with reference to FIG. 4 by example of preparation of a suspended line structure in the commercial SCR500 photoresist applied on the glass substrate using the laser micro/nano fabrication system and method of the invention.

Figure 7:
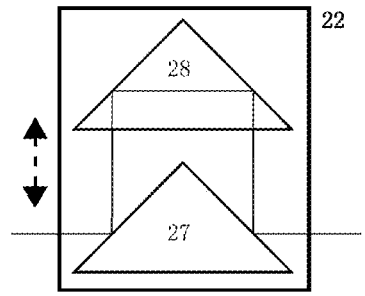
FIG. 7 is a schematic of an optical delay assembly according to another example of the present invention.
Figure 9:
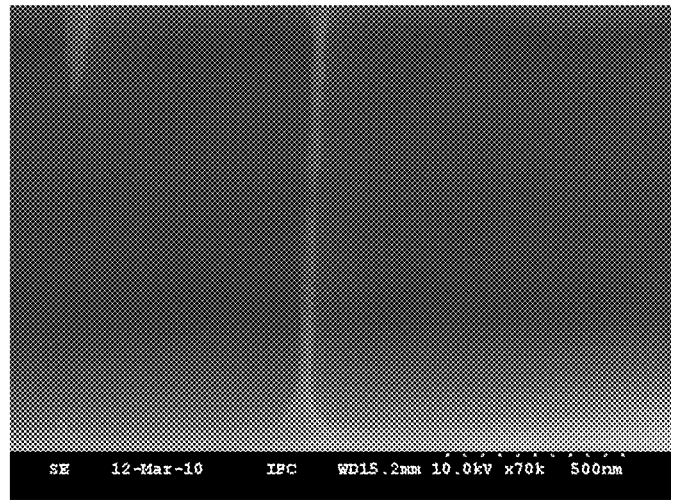
FIG. 9 illustrates SEM photographs of the suspended line structure according to example 2 of the present invention.

Except for the delay assembly 9, the other elements used in this example are as the same as the elements used in Example 1. In the reflection path of the half transmitting and half reflecting mirror 3, a reflecting mirror 4 made of glass BK7 for example, is placed along the main axis to keep the reflection path to be parallel to another path. Following the mirror 3, the optical delay assembly 9 is provided including a one-dimensional micromovement platform 22 and two right-angle prisms made of glass BK7 27 and 28, shown in FIG. 7. Then a 35-mm lens 10 and a 150-mm lens 11 are placed for expanding the fundamental frequency laser beam, and a 800-nm half-wave plate 14 is placed with its optical axis being consistent with the polarizing direction of the fundamental frequency laser beam. A dichroic mirror 18 made of glass BK7 and a reflecting mirror 19 made of glass BK7 are then placed for combining the two laser beams into one. An oil-immersion objective 20 with the numerical aperture of 1.45, and magnification of 20 is place for focusing the superposed laser beams into the photosensitive material on the computer controlled three-dimensional micro-movement stage 21. The movement speed of the stage is set to 170 nm/ms. The variable attenuators 16 and 17 are adjusted such that the average power of the 400-nm laser is 2.5 µW, the average power of the 800-nm laser is 12.23 mW. The photosensitive material is thus exposed. The photosensitive material without interacting with the laser is removed in the absolute ethyl alcohol solution, and the suspended line structure obtained between the preformed cuboids with a gap of 1 µm is shown in FIG. 9, with the resolution smaller than 25 nm.

Example 3

The specific steps will be described with reference to FIG. 4 by example of preparation of a two-dimensional dot matrix structure in the commercial SCR500 photoresist applied on the glass substrate using the laser micro/nano fabrication system and method of the invention.

Figure 10:
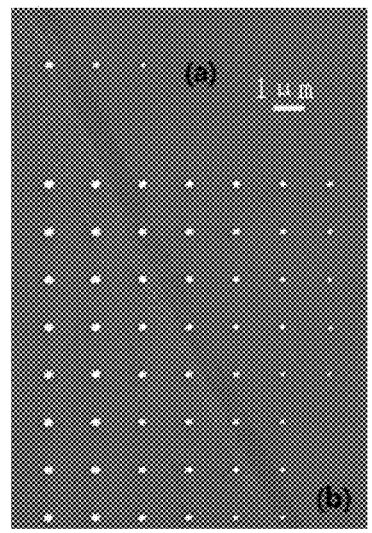
FIG. 10 illustrates SEM photographs of the two-dimensional dot matrix structures according to example 3 of the present invention and a comparative example 2.

The laser fabrication system of Example 1 is used. The computer controlled three-dimensional micro-movement stage 21 is adjusted such that the superposed focus of the two laser beams is located at the interface between the glass substrate and the photosensitive material. The optical shutters are adjusted such that the exposure times of the two beams are 100 ms respective. The variable attenuator 17 is adjusted such that the average power of the 400-nm laser is 4.2 µW~6.0 µW, the variable attenuator 16 is adjusted such that the average power of the 800-nm laser varies in range of 15.02 mW~10.34 mW. The photosensitive material is thus exposed. The photosensitive material without interacting with the laser is removed in the absolute ethyl alcohol solution, and the two-dimensional dot matrix structure obtained on the glass substrate is shown in FIG. 10(b). In FIG. 10(b), for the lines from left to right, the average power of the 400-nm laser is unchanged, while the average power of the 800-nm laser is adjusted in this order to 15.02 mW, 14.12 mW, 13.20 mW, 12.34 mW, 11.50 mW, 10.84 mW, 10.34 mW; for the lines from top to bottom, the average power of the 800-nm laser is unchanged, while the average power of the 400-nm laser is adjusted in this order to 6.0 µW, 5.8 µW, 5.6 µW, 5.4 µW, 5.2 µW, 5.0 µW, 4.8 µW, 4.6 µW. In this example, a dot with the resolution smaller than 130 nm may be achieved when the 400-nm laser at average power of 4.6 µW and 800-nm laser at average power of 10.84 mW are used.

Comparative Example 2

The result of the comparative example 2 is obtained by scanning the photosensitive material with only the single 800-nm laser beam, and keeping other conditions of the experiment as the same as that of the example 3. The power of the 400-nm laser beam is adjusted to 0 W with the variable attenuator 17, and the average power of the 800-nm laser beam is varied in range of 15.02 mW~13.20 mW. The photosensitive material is thus exposed. The part of the photosensitive material without interacting with the laser is removed in the absolute ethyl alcohol solution, and the dot matrix structure obtained on the surface of the glass substrate is shown in FIG. 10(a). The dots in FIG. 10(a) are obtained by the 800-nm laser at the average power of 15.02 mW, 14.12 mW, 13.20 mW in this order, and a processing resolution of 155 nm is achieved with the average power of 13.20 mW. The dot structure is not observed with the 800-nm laser beam at average power lower than 13.20 mW.

It can be seen, by selecting the wavelength at which the photosensitive material to processed may occur multi-photon absorption and adjusting the powers of the first and the second laser beams, a processing resolution smaller than 130 nm may be achieved, which is better than the resolution of 155 nm by use of the single 800-nm laser. It also can be seen that the energy used by the two laser beams is less than the energy used by the single beam.

Example 4

The specific steps will be described in combination with the drawings to the system of the invention and the example of preparation of a polymerization dot structure in the commercial SCR500 photoresist on the glass substrate.

Figure 11:
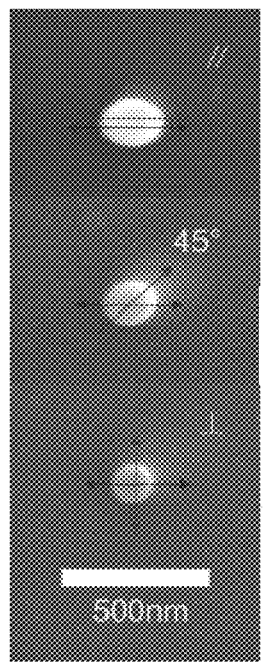
FIG. 11 illustrates SEM photographs of the polymerization point according to example 4 of the present invention.

The system includes a femtosecond Ti: sapphire laser 1, which outputs a laser beam having wavelength of 800 nm, pulse width of 100 fs, pulse repetition rate of 82 MHz, the diameter of 1.8 mm and at linear polarization state. Turning on the laser 1, the output laser transmits through and reflects by the half reflecting and half transmitting mirror 3 made of e.g. glass BK7, with the ratio of transmission/reflection of e.g. 7:3. The transmitted laser beam passes through the 1-mm type I BBO frequency-doubling crystal 5 and the interference filter 6 for filtering out 800-nm laser placed in this order along the main axis of the light path of the transmission light, results in the pure laser frequency-doubled laser beam at the wavelength of 400 nm and diameter of 1.2 mm. The frequency-doubled laser beam is expanded by the 60-mm lens 12 and the 150-mm lens 13. The reflected laser beam is further reflected by a reflecting mirror 4 made of glass BK7, placed along the main axis in the light path of the reflection light, such that the further reflected laser travels in parallel to the transmission light. Through the optical delay assembly 9 including the one-dimensional micromovement platform 22 and the four reflecting mirrors made of glass BK7, the 35-mm lens 10 and a 150-mm lens 11, the expanded fundamental frequency laser is obtained. The fundamental frequency laser beam passes through the 800-nm half-wave plate 14 to have its optical axis adjusted such that the angle between polarization directions of the fundamental laser and the frequency-doubled laser is 0°, 45°, and 90°, respectively. The two laser beams are superposed by the dichroic mirror 18 made of glass BK7 and the reflecting mirror 19 and formed the superposed laser beams. The superposed laser beams pass through the oil-immersion objective with the numerical aperture of 1.45, and magnification of 20 and focuses into the photosensitive material on the computer controlled three-dimensional micro-movement stage 21. The stage 21 is adjusted such that the focus of the superposed laser beam is positioned at the interface of the glass substrate and the photosensitive material. The exposure times of the two beams are adjusted to 100 ms by the optical shutters 7 and 8. With the variable attenuators 16 and 17, the average power of the 400-nm laser is adjusted to 5.8 µW and the average power of the 800-nm laser to 12.34 mW, 13.20 mW and 11.79 mW, for the three polarization directions respectively. The photosensitive material is thus exposed. The photosensitive material without interacting with the laser is removed in the absolute ethyl alcohol solution. The polymerization dots with the resolution smaller than 135 nm obtained on the surface of the glass substrate is shown in FIG. 11. It can be seen, the resultant processing accuracy of the laser fabrication system can be improved by changing the polarization direction of the laser beam.

Embodiment 2

Figure 12:
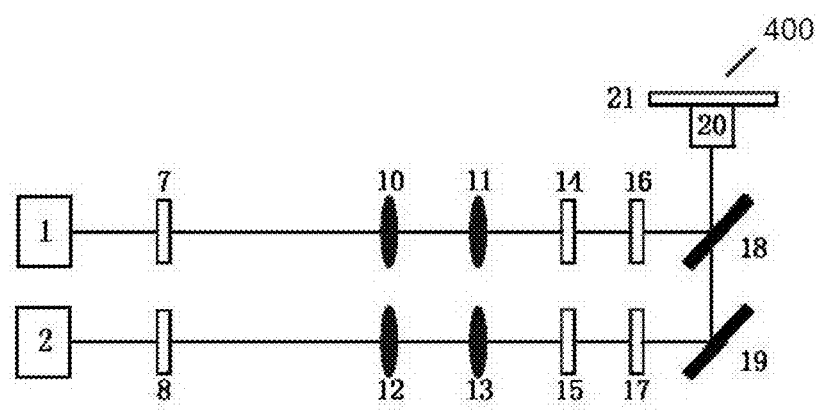
FIG. 12 is a layout of the laser fabrication system according to Embodiment 2 of the present invention.

FIG. 12 illustrates a laser micro/nano fabrication system 400 according to Embodiment 2 of the invention. The laser micro/nano fabrication system 400 includes in the first light path a first laser 1, a first optical shuttle 7, a first group of lenses including lens 10 and lens 11, and attenuator 16; in the second light path a second laser 2, a second optical shuttle 8, a second group of lenses including lens 12 and lens 13, and attenuator 17; as well as a dichroic mirror 18 and a reflecting mirror 19, an objective 20 and a computer controlled three-dimensional micromovement stage 21. The first laser 1 generates the first laser beam having the pulse width in range of nanosecond to femtosecond, the repetition frequency in range of 1 Hz-100 MHz, and the wavelength being adjustable in range of 157 nm-1064 nm. The optical shutter 7 is provided for opening and shutting off the light path of the first laser. The lenses 10 and 11 are provided for expanding the laser beam from the first laser 1, and the attenuator 16 is provided for controlling the laser power of the first laser beam incident into the sample. The second laser 2 is preferably a continuous wave laser for outputting the second laser beam capable of inducing the optical tweezers and surface plasma absorption, the wavelength of the second laser beam is adjustable in range of 300 nm-1064 nm. The optical shutter 8 is provided for opening and shutting off the light path of the second laser. The lenses 12 and 13 are provided for expanding the second laser beam from the second laser 2, and the attenuator 17 is provided for controlling the laser power of the second laser beam incident into the sample. The reflecting mirror 19 is provided for reflecting the second laser beam into the objective, and the dichroic mirror 18 is provided for reflecting the first laser beam into the objective and passing through the second laser beam, and thus the first and the second laser beams are superposed into the superposed laser beams traveling along the same light path. The objective is provided for focusing the superposed laser beams into sample placed on the three-dimensional micromovement stage 21. The system further includes a wave plate 14 in the light path of the first laser beam and a wave plate 15 in the light path of the second laser beam. Preferably, the wave plate is a full-wave plate, a half-wave plate or a quarter-wave plate of the laser wavelength in the corresponding light path. The lenses 10, 11, 12, and 13 are preferable the lens with focal length in range of 1 mm-500 mm. Preferably, the objective is a non-immersion objective, water immersion objective, or oil immersion objective, with the numerical aperture of 0.75-1.65, and magnification of 10-100. The micromovement stage in the system is controlled by the computer and is movable in range of 1 nm-200 mm.

Figure 13:
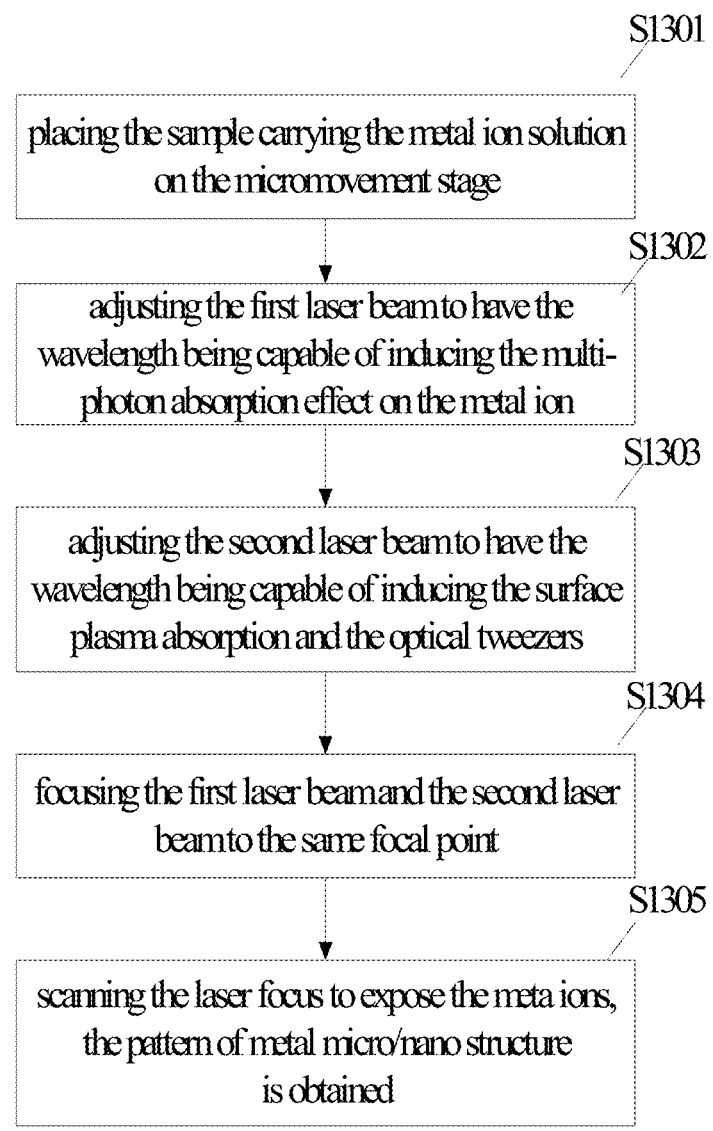
FIG. 13 is a schematic of method for fabricating a metal micro/nano structure by using the system shown in FIG. 12.

FIG. 13 is a schematic of method for fabricating a metal micro/nano structure according to invention.

Firstly, the sample carrying the metal ion solution is placed on the micromovement stage, S1301.

Figure 14:
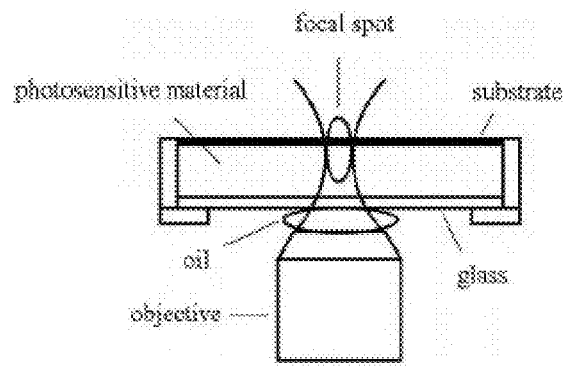
FIG. 14 is a schematic of fabricating a metal micro/nano structure by scanning the laser beam on the photosensitive material according to the present invention.

The sample carrying the metal ion solution includes a substrate and the metal ion solution applied on the substrate. Normally, the substrate is the glass substrate, such as the ordinary optical glass substrate, ITO glass substrate or FTO glass substrate, quartz substrate, ceramic substrate, oxide substrate, such as the zirconia substrate, or semiconductor substrate. A thin film is preferably applied or deposited on the substrate as desired so as to obtain a better metal structure. In order to prevent the solution from evaporation during the preparation of the metal micro/nano structure, a sandwich structure including the substrate, the metal ion solution and the auxiliary transparent substrate may be used to seal the solution. For example, a sample slot may be formed in the substrate. The slot is filled with the solution and then is covered with the auxiliary substrate and thus formed the sandwich structure. For the opaque substrate or the substrate with the thickness thicker than the working distance of the focusing objective, the laser beam was incident into the solution and scanning the designated position from the auxiliary transparent substrate side of the sandwich structure. FIG. 14 illustrates the sandwich structure with the laser incident from the auxiliary transparent substrate, and the photosensitive material in this example is metal ion solution.

The metal ion solution may be silver ion solution, gold ion solution, platinum ion solution, copper ion solution, ferric ion solution, nickel ion solution, cobalt ion solution, or palladium ion solution.

The metal ion solution may further include a surfactant, such as n-decanoylsarcosine sodium, sodium citrate, cetyl trimethylammonium bromide, sodium dodecyl benzene sulfonate, sodium butyrate, sodium valproate, sodium caproate, sodium caprylate, sodium caprate, and the a mixture including at least two of them.

The first laser and the second laser are adjusted to output the first and the second laser beams respectively.

The laser beam output from the first laser 1 is adjusted to have the first wavelength being capable of inducing the multi-photon absorption effect such that the metal ions in the solution occur the photoreduction reaction and form metal nanoparticles, S1302.

The laser beam output from the second laser 2 is adjusted to have the second wavelength being capable of inducing the surface plasma absorption and the optical tweezers on the reduced metal nanoparticles, S1303.

Then, the first and the second laser beams are focused to the same focal point, S1304.

By adjusting the corresponding optical elements in the system, the first and the second laser beams are superposed to the superposed laser beam traveling along the same light path, and the superposed laser beam was focused to the same focal point through the objective.

Then, the metal ion solution is exposed by scanning the laser focus, and the metal micro/nano structure is obtained in the solution, S1305.

By adjusting the micromovement stage in the system, the laser focus of the superposed laser beams is moved in the solution so as to achieve the predetermined metal nanostructure. The metal ions in the solution is induced the multi-photon effect and reduced to metal nanoparticles with the first laser beam. The formed metal nanoparticles are aggregated to the focus with the second laser beam and formed the metal micro/nano structure as the laser beams move.

Example 5

The invention will be described in detail by example of preparation of silver nanoline on the glass substrate.

Firstly, the sample carrying the silver ion solution is placed on the micromovement stage.

The sample carrying the silver ion solution includes glass substrate, the silver ion solution applied on the substrate and the auxiliary transparent substrate. In the silver ion solution, the concentration of the silver ion is 0.01M-0.5M, the concentration of the surfactant, n-decanoylsarcosine sodium, is 0.01M-0.2M. In order to prevent the solution from evaporation during the preparation of the metal micro/nano structure, a sandwich structure consisting of the glass substrate, the silver ion solution and the auxiliary transparent substrate is used in this example to seal the solution.

Then, the first laser and the second laser are adjusted to output the first and the second laser beams respectively.

The laser beam output from the first femtosecond Ti: sapphire laser 1 is adjusted to have the wavelength of 780 nm, the pulse width of 100 fs, the repetition frequency of 82 MHz, and the diameter of 1.8 mm, at which the multi-photon absorption effect may be induced on the metal ions in the solution. The continuous wave laser beam output from the second He—Ge continuous wave laser 2 is adjusted to have the second wavelength of 441.6 nm at which the surface plasma absorption and the optical tweezers may be induced on the resultant metal nanoparticles.

Then, the first and the second laser beams are focused to the same focal point.

By adjusting the optical elements in the system, the first and the second laser beams are superposed into the superposed laser beams traveling along the same light path, and the superposed laser beam was focused to the same focal point through the oil-immersion objective with the numerical aperture of 1.45, and magnification of 100. As shown in FIG. 14, the superposed laser beams are focused through the objective into the silver ion solution between the glass substrate and the auxiliary substrate placed on the computer-controlled three-dimensional micromovement stage.

Then, the silver ion solution is scanned by the laser focus in the solution As the laser focus moves in the metal ion solution, the metal micro/nano structure is obtained Adjusting the micromovement stage 302 such that the laser focus scans the solution from the contact surface of the solution and the glass substrate. The silver ion was induced the multi-photon absorption effect and was reduced to silver nanoparticles under the first laser beam at the wavelength of 780 nm, and the resultant silver nanoparticles was aggregated and melt towards the focal point under the second laser beam at the wavelength of 441.6 nm, thus the silver nano line is obtained as the laser focus scans. When the power of the first laser beam is 2.0-0.1 mW and the power of the second laser beam is 4.0-0.1 mW, the moving speed of the micromovement stage is 20 nm/ms-2 nm/ms, the silver nano line with the width of 150-50 nm is achieved on the glass substrate.

After washing the substrate and removing the remaining solution, the metal micro/nano structure is obtained.

Figure 15:
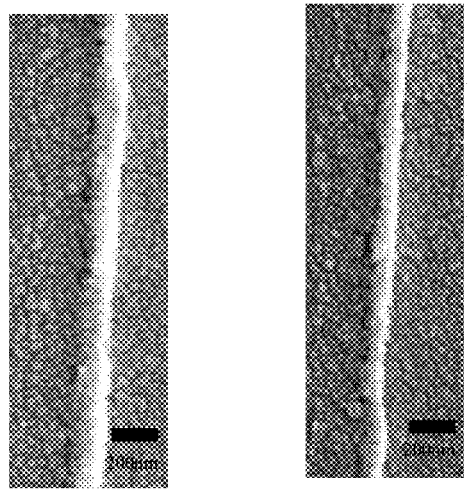
FIG. 15 illustrates SEM photograph of the obtained silver nanoline according to example 5 of the present invention.

FIG. 15 illustrates the SEM photograph of the obtained silver nanoline according to example 5 of the invention, when the first femtosecond laser beam has the wavelength of 780 nm, the power of 0.85 mW and 0.51 mW respectively, and the second continuous wave laser beam has the wavelength of 441.6 nm, and the power of 2.00 mW. The width of the silver nanoline is 117 nm and 77 nm, respectively.

Comparative Example 3

Figure 16:
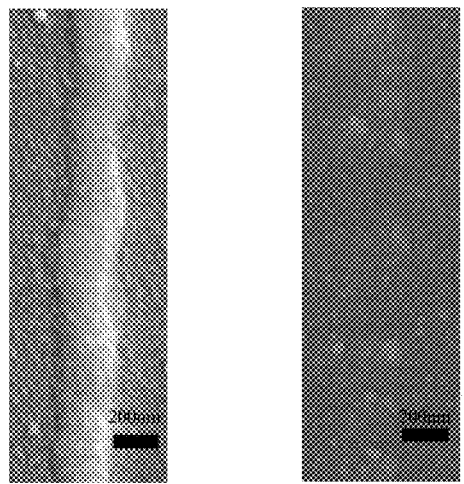
FIG. 16 illustrates SEM photograph of the obtained silver line according to comparative example 3.

As a comparison, FIG. 16 illustrates the SEM photograph of the obtained silver nanolines by scanning the silver ion solution with only 780-nm femtosecond laser beam and keeping other experimental conditions as the same as that in example 5. The width of the silver nanoline obtained is 255 nm when the power of the femtosecond laser beam is 0.85 mW. No silver line is observed when the power is 0.51 mW.

Example 6

Figure 17:
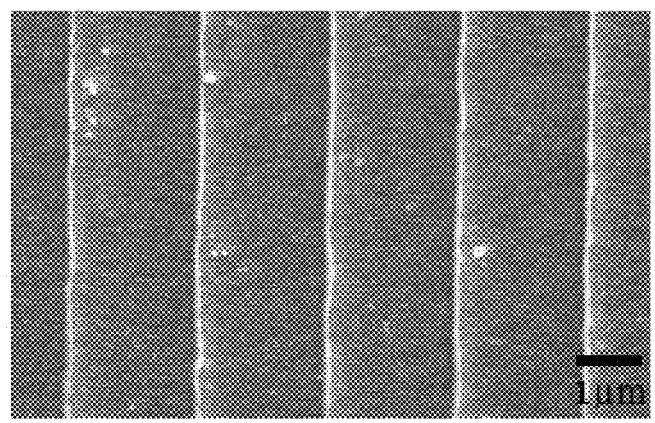
FIG. 17 illustrates SEM photograph of the obtained silver nanoline array according to example 6 of the present invention.

Keeping the other experimental conditions as the same as that in example 5, the silver nanoline is prepared when the first femtosecond laser beam has the wavelength of 780 nm, the power of 0.484 mW, and the second continuous wave laser beam has the wavelength of 441.6 nm, the power of 2.47 mW. The sample is moved by the computer controlled three-dimensional micromovement stage, and thus the silver nanoline array is obtained. The SEM photograph of the resultant structure is shown in FIG. 17.

Example 7

Figure 18:
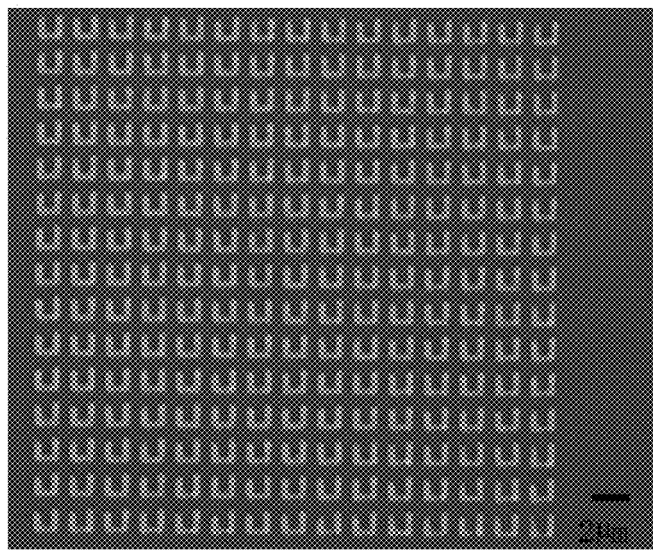
FIG. 18 illustrates SEM photographs of the obtained open-loop resonator array according to example 7 of the present invention.

Keeping the other experimental conditions as the same as that in example 5, and scanning the silver ion solution with the focus of superposed laser beams and moving the micromovement stage under the pre-programmed control, the two-dimensional array of open-loop resonators is obtained. The SEM photograph of the resultant structure is shown in FIG. 18.

Embodiment 3

In the femtosecond laser direct-writing method, the reaction of the laser beams with the substance does not occur every area where the laser beams pass through, but only in the area where the photochemical reaction occurs via the two-photon absorption in the substance. In case a single laser beam is incident, the substance absorbs two photons at the same time, the absorption efficiency is in proportion to the square of the intensity of the laser focus, and the processing resolution is dependent on the square of the intensity distribution function of the laser focus. In case that two laser beams with different wavelengths are incident, the substance absorbs two photons at different frequency, the absorption efficiency is in proportion to the product of the intensities of the two laser focus, and the processing resolution is dependent on the product of the intensity distribution functions of the laser focus.

Figure 19:
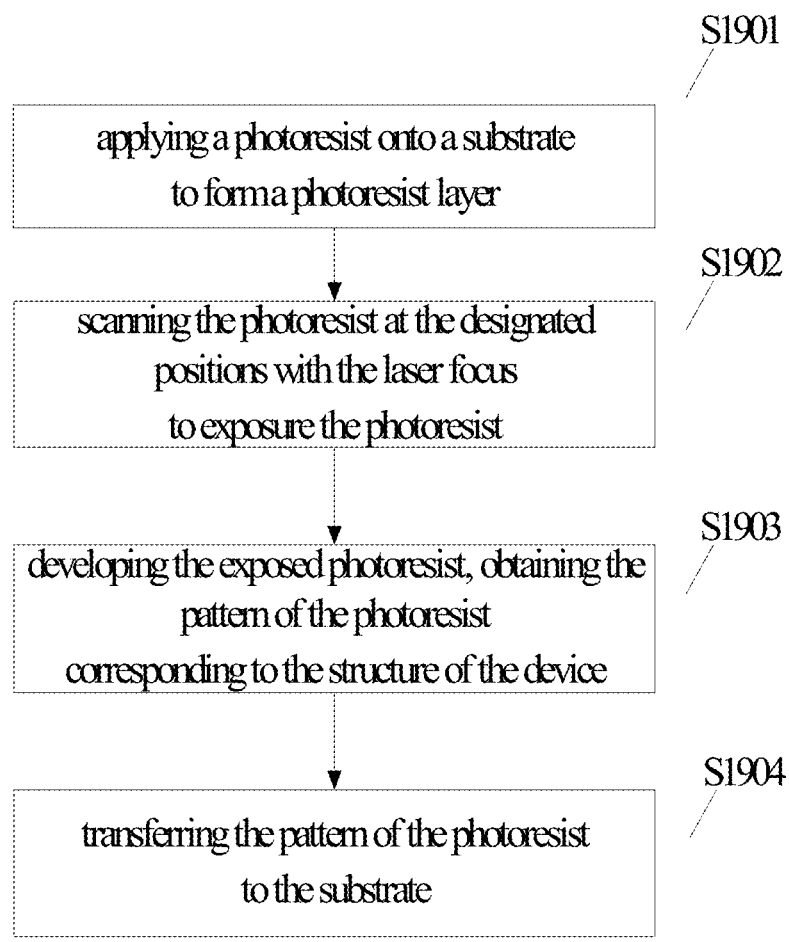
FIG. 19 is a schematic of method for fabricating a micro/nano device according to a Embodiment 3 of the present invention.

The method for fabricating the micro/nano device according to the invention is described in detail by example of combining the laser direct-writing with the semiconductor fabrication steps. FIG. 19 is a schematic of method for fabricating a micro/nano device according to the invention. The method includes steps of applying a photoresist onto a substrate to form a photoresist layer, S1901, scanning the photoresist at the designated positions with the laser focus to exposure the photoresist, S1902, developing the exposed photoresist, thus obtaining the pattern of the photoresist corresponding to the structure of the device, S1903, and transferring the pattern of the photoresist to the substrate, S1904.

In order to prepare the micro/nano structural semiconductor device, the material of the substrate may be Group IV material, Group III-V material, or Group II-VI material, such as Si, GaN, GaAs, or the substrate may be a silicon-on-insulator (SOI) substrate, a glass substrate formed with a layer of dielectrics such as silicon oxide or silicon nitride, a glass substrate and a semiconductor substrate formed with a layer of dielectrics. Normally, the substrate is neither transmissive to the visible light nor to the laser. In order to focus the laser beams to have nano-scaled spot on the photoresist and to enable the photoresist to have better two-photon absorption to the laser beam, the laser should be incident into the photoresist from the side opposite to the substrate.

Figure 20:
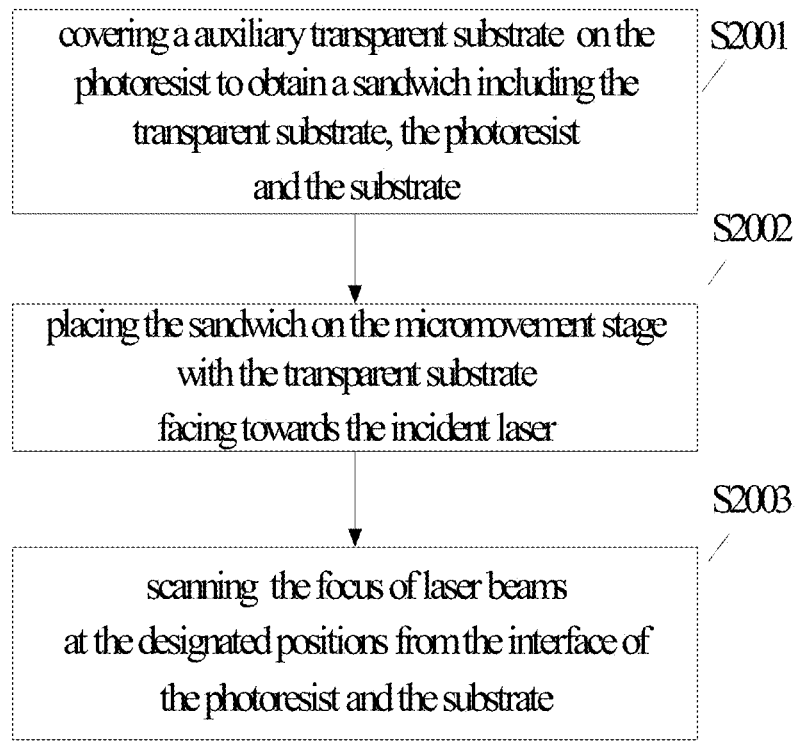
FIG. 20 is a schematic of steps for exposing the photoresist in the method shown in FIG. 19.

FIG. 20 illustrates the steps of the scanning and exposing step in the fabrication method shown FIG. 19.

Following the step of applying the photoresist onto the substrate to form the photoresist layer, shown in step S1901 in FIG. 19, the method further includes covering a auxiliary transparent substrate such as a glass substrate on the applied photoresist so as to obtain a sandwich structure including the auxiliary transparent substrate, the photoresist layer and the substrate, S2001; placing the resultant sandwich structure on the micromovement stage of the fabrication system with the auxiliary transparent substrate facing towards the laser incident direction, S2002. The relative position of the sandwich structure and the objective in the fabrication system is shown in FIG. 14. The auxiliary transparent substrate provided between the photoresist and the objective may prevent the objective from the pollution of the photoresist. The laser beams are focused onto the interface of the photoresist and the substrate. The photoresist is exposed via the laser two-photon absorption effect at the designated positions. The oil-immersion objective is normally used in the fabrication system for focusing the laser beams. Since the refractive indexes of the oil and the glass are proximate, the laser beam may form a smaller sized focal spot when passes through the substances with the matching refractive indexes, and the processing resolution may be improved. Meanwhile, the lens of the objective is protected from damage by using oil-immersion objective and providing the auxiliary transparent substrate between the objective and the photoresist layer. Therefore, the material of the auxiliary substrate is preferably selected to have a refractive index matching to that of the oil.

According to the above preferred embodiment, by forming the sandwich structure consisting of the opaque substrate, photoresist layer and the auxiliary transparent substrate, and scanning the photoresist with the laser focus through the auxiliary transparent substrate, the laser two-photon direct writing to the photoresist applied on the semiconductor substrate may be achieved. To apply the preferred embodiment of the present application to the fabrication step of the semiconductor device, the photoresist formed on the substrate may be exposed directly without any photomask used in the conventional semiconductor fabrication procedures, which may simplify the fabrication procedures, reduce the cost and obtain the semiconductor device with nano scaled feature sizes of about 10 nm to about 100 nm.

The photoresist to be applied on the substrate is the negative photoresist or the positive photoresist that may occur laser two-photon absorption. The positive photoresist may be UV positive photoresist or DUV positive photoresist, for example. The thickness of the photoresist layer may be 10 nm-100 μm, for example.

The photoresist is exposed with the laser focus of superposed first laser beam and second laser beam. The micromovement stage in the laser micro/nano fabrication system is adjusted such that the focus of the superposed laser beams is moved in the photoresist layer to expose the photoresist. The wavelength, exposure power, exposure time of the laser beams, and the movement speed of the micromovement stage are selected in accordance with the type of the photoresist. The photoresist is decomposed by the two-photon exposure and forms the feature structure such as hole or slot.

The pattern in the photoresist layer is transferred to the substrate e.g. semiconductor substrate by the method such as metal evaporating or sputtering, depositing a semiconductor layer or a dielectric layer, and wet etching or dry etching.

Furthermore, in order to obtain a complete semiconductor device with micro/nano scaled structural feature, further steps may be included, but not limit to, laser two-photon direct writing, metal evaporation or sputtering, and etching.

The invention will be further explained by the following example.

Example 8

A FinFET device formed on the SOI substrate will be explained in detail with reference to FIGS. 21-28.

Firstly, applying the photoresist on the SOI substrate to form a photoresist layer.

Figure 21:
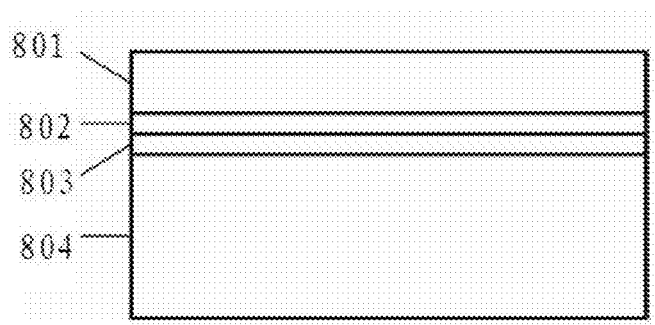
FIG. 21 is a sectional schematic of the photoresist formed on the SOI substrate according to example 8 of the present invention.
Figure 22:
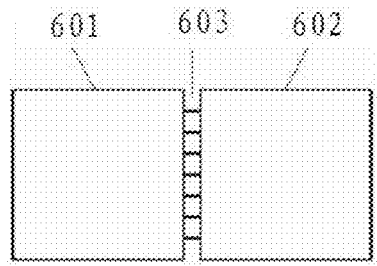
FIG. 22 is a schematic of designated pattern formed in the photoresist according to example 8 of the present invention.

The negative type photoresist SCR500 is applied on the SOI substrate and obtain a photoresist layer 801, shown in FIG. 21. The SOI substrate includes a top silicon layer 802, an insulating layer of silicon oxide 803 and silicon substrate 804 in this order from the top. The thickness of the top silicon layer is 55 nm for example, and the thickness of the insulating layer is 150 nm for example.

Then, the photoresist layer is exposed vis the laser two-photon absorption, and a pattern of FinFET device is formed in the photoresist layer.

Turning on the laser light source in the fabrication system. The laser light source is a femtosecond pulsed Ti: sapphire laser, which outputs a laser beam having wavelength of 800 nm, pulse width of 100 fs, pulse repetition rate of 82 MHz, and the diameter of 1.8 mm and being in linear polarization state. A splitter is used to split the laser beam into two light paths. In the first light path, a 1-mm type I BBO frequency-doubling crystal and an interference filter 6 for filtering out 800-nm laser are placed to obtain the first laser beam at wavelength of 400 nm. The 400-nm first laser beam in the first light path and the 800-nm second laser beam in the second light path are expanded respectively, and are superposed into the superposed laser beams traveling along the same light pass by a half transmitting and half reflecting mirror. The superposed laser beams are focused through the oil-immersion objective with the numerical aperture of 1.45, and magnification of 20 into photoresist 801 on the computer-controlled three-dimensional micromovement stage. The stage is adjusted such that the focus of the superposed laser beam scans the photoresist from the interface of top silicon layer and the photoresist and exposes the photoresist at the designated positions shown in FIG. 22. A pattern including a mesa structure 601, 602 for forming a source and a drain, as well as an active region are obtained. By adjusting the average power of the first laser beam by the attenuator in the first light path to 1.5 μW and the average power of the second laser beam by the attenuator in the second light path to 4.43 mW, and setting the moving speed of the stage to 80 nm/ms, the formed active region 603 may have a nanoline structure with resolution of 96 nm, shown FIG. 22.

Figure 23:
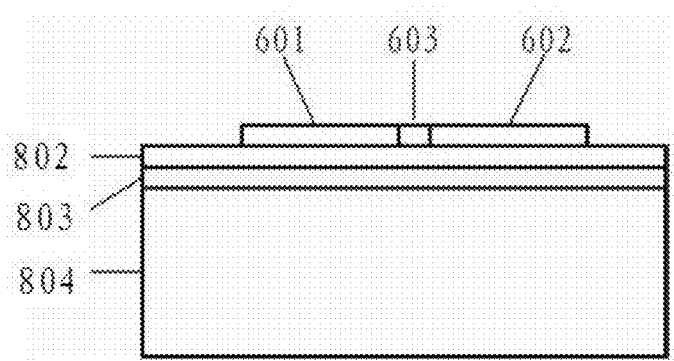
FIG. 23 is a sectional schematic of the obtained structure after the exposure and developing the structure shown in FIG. 12.
Figure 26:
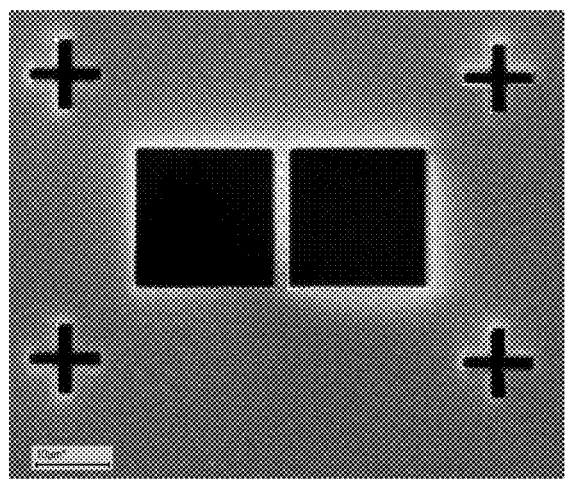
FIG. 26 illustrates SEM photograph of the structure shown in FIG. 23.

Then, after the development step, the structural pattern of FinFET device is obtained in the photoresist by removing the unexposed part of the photoresist. The sectional structure is shown in FIG. 23 and the SEM photograph is shown in FIG. 26.

Then, the patter in the photoresist is transferred to the SOI substrate.

Figure 24:
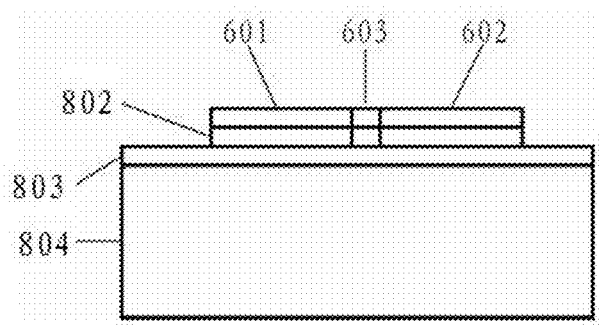
FIG. 24 is a sectional schematic of the obtained structure after pattern transferring the structure shown in FIG. 23.

The inductively coupled plasma etching is used to etch the top silicon layer for 15 s in mode of shallow 2 LR3, and expose out the buried silicon oxide layer in the area without the photoresist layer, shown in FIG. 24. Immersing the sample into the mixing solution of the concentrated sulfuric acid and hydrogen peroxide with a volume ratio of 3:1 at 200° C. for 20 minutes, the photoresist used as the mask is removed and the resultant structure is shown in FIG. 25.

Figure 25:
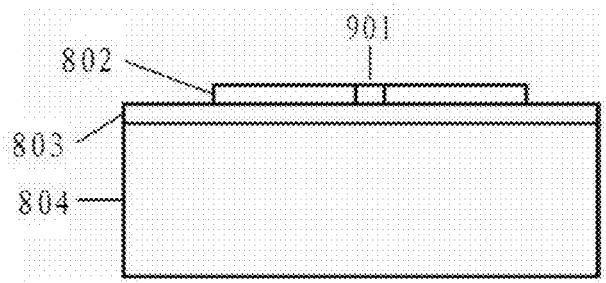
FIG. 25 is a sectional schematic of the obtained structure after peeling off the photoresist in the structure shown in FIG. 23.
Figure 27:
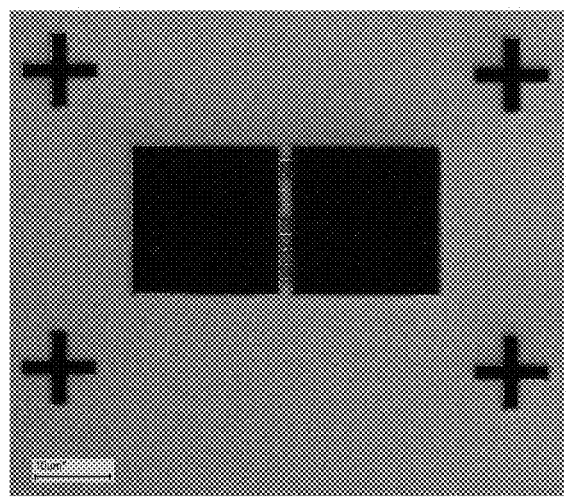
FIG. 27 illustrates SEM photograph of the structure shown in FIG. 25.

FIG. 27 is the SEM photograph corresponding to the structure shown in FIG. 25. It can be seen that the width of the silicon nanoline resulting from the laser two-photon direct writing according the present invention is 66 nm.

Then, the desired semiconductor device will be obtained by processing the resultant structure with conventional semiconductor fabricating procedures.

For example, the mesa structure including the Fin structure as shown in FIG. 27 is oxidized to form silicon oxide ($SiO_2$) dielectric layer. A doped polysilicon layer is formed on the SiO₂ layer by low-pressure chemical vapor deposition (LPCVD). The silicon layer becomes the polysilicon gate by lithography, such as photolithograpy, electron beam direct writing, or femtosecond laser direct writing.

Figure 28:
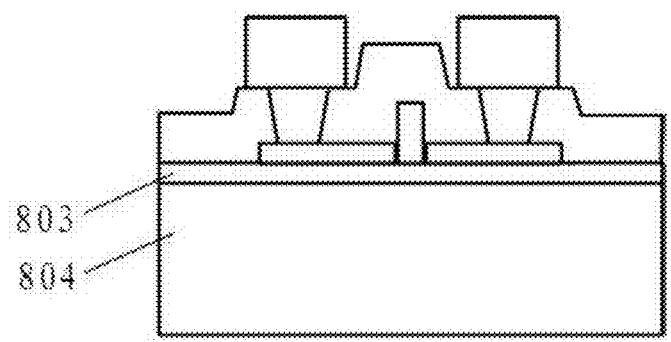
FIG. 28 is a sectional schematic of the obtained device according to example 8 of the present invention.

Using the polysilicon gate as a mask, the mesa region is processed to form the source region and the drain region by a self-aligned ion implantation and rapid annealing. A silicon oxide protection layer is formed by plasma enhanced chemical vapor deposition (PECVD). The holes for metal wiring are formed in the deposited protection layer by photolithography, electron beam direct writing, or femtosecond laser direct writing. Using conventional metallization processes to form the electrodes. Thus, the device structure as shown in FIG. 28 is obtained.

The above embodiments are described to help understand the present invention. It should be appreciated that the invention is not limited to the preferred embodiment disclosed herein, the invention is subject to considerable modification and substitutions without departing from the scope or spirit of the claims, which are appended hereto.

This work was supported by National 973 Program (2010CB934100).

What is claimed is:

1. A laser micro/nano fabrication method, comprising:
   adjusting a laser light source to output a first laser beam having a first wavelength and a second laser beam having a second wavelength being different from the first wavelength, the first wavelength of the first laser beam being one that induces a multiphoton effect to a photosensitive material to be processed, the first laser beam having a pulse width in a range of a nanosecond to a femtosecond;
   adjusting an optical focusing assembly to focus the first laser beam and the second laser beam to a same focal point; and
   adjusting a computer controlled micromovement stage such that the photosensitive material to be processed on a stage is exposed at the focal point.

2. The laser micro/nano fabrication method of claim 1, wherein the photosensitive material to be processed is selected from organic photosensitive material, inorganic sensitive material and photosensitive material comprising metal ion.

3. The laser micro/nano processing method of claim 1, wherein the second laser beam has a pulse width in a range of a nanosecond to a femtosecond, and the method further comprises,
   adjusting the wavelength of the second laser beam to one that induces a two-photon effect to the photosensitive material to be processed; and
   adjusting an optical path of the first laser beam or an optical path of the second laser beam such that the lag between the times when the first laser beam and the second laser beam arrive at the focal point is not more than the lifetime of the excited state of the photo-sensitive material to be processed.

4. The laser micro/nano processing method of claim 1, wherein the photosensitive material to be processed is a metal ion solution, and the second laser beam is continuous wave laser beam or pulsed laser beam, the method further comprises:
   adjusting the first laser beam to reduce the metal ions to metal nanoparticles, and
   adjusting the second wavelength of the second laser beam such that the second laser beam functions as optical tweezers to the formed metal nanoparticles.

5. The laser micro/nano processing method of claim 4, wherein step of adjusting the second wavelength of the second laser beam such that the metal nanoparticles function as optical tweezers further comprises adjusting the second wavelength of the second laser beam such that the second laser beam induces surface plasma absorption and functions as optical tweezers to the formed metal nanoparticles.

6. The laser micro/nano processing method of claim 4, wherein the metal ion solutions comprises a silver ion solution, a gold ion solution, a platinum ion solution, a copper ion solution, a ferric ion solution, a nickel ion solution, a cobalt ion solution, or a palladium ion solution.

7. The laser micro/nano processing method of claim 4, wherein the metal ion solution further comprises surfactant.

8. The laser micro/nano processing method of claim 1, wherein a micro/nano structure obtained by the method is a one-dimensional structure, a two-dimensional structure or a three-dimensional structure.

9. A method for fabricating a micro/nano structural device by laser two-photon direct writing, comprising:
   applying a photoresist onto a substrate to form a photoresist layer;
   adjusting a laser light source to output a first laser beam having a first wavelength and a second laser beam having a second wavelength being different from the first wavelength, both of the first wavelength and the second wavelength being capable of inducing a two-photon absorption effect to the photoresist, both of the first laser beam and the second laser beam having pulse widths in a range of a nanosecond to a femtosecond;
   superposing the first laser beam and the second laser beam to superposed laser beams traveling along the same path;
   focusing the superposed laser beams to a same focal point;
   scanning the focal point to expose the photoresist at designated positions;
   developing the photoresist; and
   transferring a resultant pattern of the photoresist to the substrate.

10. The method of claim 9, wherein the micro/nano structure device is a semiconductor device.

11. The method of claim 9, wherein following the step of applying the photoresist onto a substrate to form the photoresist layer, the method further comprising,
   placing an auxiliary transparent substrate on the photoresist layer to obtain a sandwich structure including the substrate, the photoresist layer and the auxiliary transparent substrate, and
   irradiating the photoresist with the laser beam from the auxiliary transparent substrate side of the sandwich structure to exposure the photoresist at the designated positions.

12. The method of claim 9, wherein the first laser beam and the second laser beam have average powers of 0.1 µW-1 W, exposure times of 1 ms-10 min, respectively.

* * * * *